US012669753B2

(12) United States Patent
Ameling et al.

(10) Patent No.: US 12,669,753 B2
(45) Date of Patent: Jun. 30, 2026

(54) EUV MULTI-MIRROR ARRANGEMENT

(71) Applicant: Carl Zeiss SMT GmbH, Oberkochen (DE)

(72) Inventors: Ralf Ameling, Aalen (DE); Fabian Haacker, Aalen (DE); Markus Holz, Aalen (DE); Johannes Eisenmenger, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 93 days.

(21) Appl. No.: 18/630,770

(22) Filed: Apr. 9, 2024

(65) Prior Publication Data

US 2025/0258437 A1     Aug. 14, 2025

Related U.S. Application Data

(63) Continuation of application No. PCT/EP2022/077809, filed on Oct. 6, 2022.

(30) Foreign Application Priority Data

Oct. 14, 2021     (DE) ..................... 10 2021 211 626.4

(51) Int. Cl.
  *G03F 7/00*       (2006.01)
  *G02B 26/08*      (2006.01)
(52) U.S. Cl.
  CPC ......... *G03F 7/702* (2013.01); *G02B 26/0858* (2013.01); *G03F 7/70116* (2013.01); *G03F 7/70825* (2013.01); *G03F 7/7085* (2013.01)
(58) Field of Classification Search
  CPC .. G03F 7/702; G03F 7/70033; G03F 7/70141; G03F 7/70825; G03F 7/7085;
  (Continued)

(56) References Cited

U.S. PATENT DOCUMENTS 6,512,323 B2 *   1/2003   Forck ................... H10N 30/057
                                                    310/330
6,573,978 B1     6/2003   McGuire
                          (Continued)

FOREIGN PATENT DOCUMENTS

DE      102008009600 A1      8/2009
DE      102015204874 A1      9/2016
                  (Continued)

OTHER PUBLICATIONS

Translation of International Search Repot for corresponding PCT Appl No. PCT/EP2022/077809, dated Jan. 30, 2023.
(Continued)

*Primary Examiner* — Christina A Riddle
(74) *Attorney, Agent, or Firm* — Fish & Richardson P.C.

(57)     ABSTRACT

An EUV multi-mirror arrangement comprises a multiplicity of mirror units arranged one next to the other in a grid arrangement on a carrier structure. Each mirror unit has a base element and, opposite the base element, an individually tiltable mirror element which has a mirror substrate that carries on a front face facing away from the base element a reflection coating for forming a mirror surface that reflects EUV radiation. Arranged between its base element and the mirror element, each mirror unit includes components of a suspension system for movably mounting the mirror element on the base element, actuators of an actuator system for producing movements of the mirror element in relation to the base element as a reaction to the reception of control signals, and sensors of a sensor system for capturing the position of the mirror elements. The actuator system has piezoelectric actuators. The sensor system has capacitive sensors.

20 Claims, 11 Drawing Sheets

(58) Field of Classification Search

CPC ............. G03F 7/70075; G03F 7/70116; G03F 7/70108; G03F 7/70233; G03F 7/70066; G03F 7/70891; G03F 7/708; G03F 7/70808; G03F 7/70816; G03F 7/70833; G03F 7/70841; G03F 7/709; G03F 7/70908; G03F 7/70916; G03F 7/70925; G03F 7/70933; G03F 7/7095; G03F 7/70958; G03F 7/70975; G03F 7/70983; G03F 7/70991; G02B 26/0858; G02B 5/0891; G02B 19/0023; G02B 26/0841; G02B 26/101; G02B 17/0663; G02B 19/0047; G02B 19/0095; G02B 26/0816; G02B 26/0833; G02B 26/085; G02B 26/105; G02B 27/18; G02B 5/09; G02B 6/356; G02B 6/3566; G02B 6/3586; G02B 7/1815; H10N 30/20; H10N 30/2042; G01C 9/06; G01D 5/24; G01D 5/2412; H02N 1/008; H02N 2/028

USPC ............................. 355/18, 30, 52–55, 66–77

See application file for complete search history.

(56) References Cited

U.S. PATENT DOCUMENTS

| | | | |
|---|---|---|---|
| 10,514,276 | B2 | 12/2019 | Ameling et al. |
| 2006/0132747 | A1 | 6/2006 | Singer et al. |
| 2011/0235015 | A1* | 9/2011 | Dengel ............... G03F 7/70141 355/71 |
| 2011/0273694 | A1 | 11/2011 | Werber et al. |
| 2012/0044474 | A1* | 2/2012 | Hauf ................... G03F 7/70291 359/872 |
| 2016/0025964 | A1 | 1/2016 | Torayashiki et al. |
| 2017/0363861 | A1 | 12/2017 | Hauf et al. |
| 2018/0074303 | A1 | 3/2018 | Schwab |
| 2022/0283428 | A1 | 9/2022 | Haspeslagh et al. |
| 2024/0019785 | A1 | 1/2024 | Ameling |

FOREIGN PATENT DOCUMENTS

| | | | |
|---|---|---|---|
| DE | 102020210024 | A1 | 2/2022 |
| EP | 1 614 008 | B1 | 4/2004 |
| WO | WO 2021/032483 | A1 | 2/2021 |
| WO | WO 2022/200294 | A1 | 9/2022 |

OTHER PUBLICATIONS

German Office Action, with translation thereof, for corresponding DE Appl No. 10 2021 211 626.4, dated Jun. 22. 2022.

* cited by examiner

EUV MULTI-MIRROR ARRANGEMENT

CROSS-REFERENCE TO RELATED APPLICATIONS

The present application is a continuation of, and claims benefit under 35 USC 120 to, international application No. PCT/EP2022/077809, filed Oct. 6, 2022, which claims benefit under 35 USC 119 of German Application No. 10 2021 211 626.4 filed on Oct. 14, 2021. The entire disclosure of each these applications is incorporated by reference herein.

FIELD

The disclosure relates to an EUV multi-mirror arrangement and to an illumination system for an EUV apparatus having at least one such EUV multi-mirror arrangement.

BACKGROUND

These days, microlithographic projection exposure methods are predominantly used for producing semiconductor components and other finely structured components. Here, use is made of masks (reticles) or other pattern generating devices, which carry or form the pattern of a structure to be imaged, e.g. a line pattern of a layer of a semiconductor component. The pattern is illuminated with the aid of an illumination system which forms, from the radiation of a primary radiation source, illumination radiation that is directed onto the pattern, is characterized by specific illumination parameters, and is incident on the pattern within an illumination field having a defined shape and size. The radiation modified by the pattern travels through a projection lens which images the pattern onto the substrate to be exposed, which is coated with a radiation-sensitive layer.

In order to be able to produce ever finer structures, in recent years optical systems have been developed which obtain high resolution capabilities substantially via the short wavelength of the electromagnetic radiation used from the extreme ultraviolet range (EUV), for example with operating wavelengths in the range of between 5 nm and 30 nm. In general, EUV radiation cannot be focused or guided with the aid of refractive optical elements, since the short wavelengths are generally absorbed by the known optical materials that are transparent at higher wavelengths. Therefore, mirror systems are used in EUV apparatuses, for example for EUV lithography.

Depending on the type of structures to be imaged, different illumination modes (also referred to as illumination settings) which can be characterized by different local intensity distributions of the illumination radiation in a pupil plane of the illumination system are typically used. In order to be able to set these flexibly, an illumination system has a pupil shaping unit for receiving radiation from the primary radiation source and for producing a variably settable two-dimensional intensity distribution in the pupil area of the illumination system.

According to some concepts, at least one controllable EUV multi-mirror arrangement (multi-mirror array, MMA) is used in the pupil shaping unit, with the controllable EUV multi-mirror arrangement having a multiplicity of individual mirror elements that are carried by a common carrier structure and that can be tilted independently of one another in order to modify the angle distribution of the EUV radiation incident on the totality of the mirror elements in a targeted manner so as to achieve the desired spatial illumination intensity distribution in the pupil plane. The mirror surfaces are substantially arranged in an area-filling manner. Such multi-mirror arrangements are frequently also referred to as facet mirrors, with the reflective front sides of the mirror elements forming the facets.

In order to be able to set the geometric reflection properties of a controllable multi-mirror arrangement in a targeted manner, the latter can have, for each mirror element, an actuator system coupled to the mirror element for controllably modifying the orientation of the mirror element in relation to the carrier structure that carries the mirror elements. Actuation movements by actuators of the actuator system are controlled via a control unit that is assigned to the multi-mirror arrangement.

In order to attain maximum flexibility when setting different illumination settings, it is generally desirable for the mirror elements to have a tilt angle range that is as large as possible. Nowadays, maximum settable tilt angles in the order of 100 mrad (millirad) or above often are desirable.

In order to capture the respectively current position of the mirror elements, a sensor system having sensors whose signals can be processed by the controller and be used for the exact closed-loop control of the orientation or tilt is present. For simplification purposes, the term "position" within the meaning of this application relates to the combination of location and orientation, which is frequently also referred to as "pose." In tilting mirrors, capturing the position is primarily focused on capturing the orientation in relation to the base element. The orientation can be quantified for example by tilt angles in relation to a neutral position (rest position without tilting).

In illumination systems for EUV lithography apparatuses, among other things, the mirror elements can additionally to dissipate the high thermal load due to the EUV radiation, which is produced by virtue of the fact that the reflection coating absorbs a significant part of the energy of the incident EUV radiation. A desired property relates to a high positioning accuracy of the mirror elements and, commonly associated therewith, a low sensitivity of the tilting to disturbances, such as temperature variations, for example.

Typical lateral dimensions of facets can lie in the order of a few centimeters, for future systems also in the range of millimeters or below ("micro-mirrors"). In this way, the geometric-optical reflection properties of the MMA with a higher local resolution can be set. For the production, technologies from the field of the production of micro-electromechanical systems (MEMS, for short) are frequently used to produce actuators, sensors, and mechanical elements, such as for example components of the suspension system, as MEMS structures.

US 2017/363861 A1 (corresponding to DE 10 2015 204 874 A1) describes a displacement device for pivoting a mirror element, produced with MEMS technology, with two degrees of freedom of pivoting. This displacement device comprises an electrode structure with actuator electrodes, which are embodied in the form of comb electrodes, which are arranged in a single plane and form a direct drive for pivoting the mirror element. The sensor system for capturing location or orientation comprises sensor transducer mirror electrodes and sensor transducer stator electrodes.

WO 2021/032483 A1 discloses a multi-mirror arrangement with tiltable mirror elements, wherein the actuator system comprises piezoelectric actuators. To capture the displacement of the mirror elements brought about with the aid of the piezoelectric actuators, piezoresistive sensor elements are provided.

SUMMARY

According to observations carried out by the inventors, certain conventional multi-mirror arrangements can involve in part relatively complex production processes. The performance at high and possibly changing thermal loads can be impaired. It may be complicated to provide a large available tilt angle range.

The disclosure seeks to provide an EUV multi-mirror arrangement in which the actuator system for operating the multiple array can be produced with relatively simple and few process steps and in which the sensor system is relatively insensitive to temperature fluctuations. At the same time, large mirror tilt angles in combination with high heat dissipation are intended to be made possible.

In an aspect, the disclosure provides an EUV multi-mirror arrangement having a multiplicity of mirror units which are arranged one next to the other in a two-dimensional grid arrangement in rows and columns on a carrier structure. Each of the mirror units has a base element and a mirror element which is mounted to be individually movable in relation to the base element. Each mirror unit can have its own base element, which can be present separately from base elements of adjacent mirror units. The base elements of the mirror units can be mounted to a common carrier structure, which may be a component that is separate from the base elements. It is also possible that base elements of a group of adjacent mirror units form a contiguous base substrate, and so the base element of a mirror unit is formed by a partial portion of the larger base substrate. The base substrate can act as carrier structure. The carrier structure and a base element can thus be embodied as the same element. A base substrate can carry many mirror elements, which are arranged in rows and columns in the manner of a matrix, for example.

A mirror element has a mirror substrate which carries on a front face facing away from the base element a reflection coating for forming a mirror surface that reflects EUV radiation. The mirror surfaces of the EUV multi-mirror arrangement are substantially arranged one next to the other in an area-filling manner. They consequently can form a reflective total surface, which is significantly larger than the individual mirror surfaces. Narrow gaps can remain between directly adjacent mirror elements in order to enable collision-free relative movement of the adjacent mirror elements with respect to one another.

Each mirror unit can have, in an intermediate space between the base element and the mirror substrate, components of a suspension system for movably mounting the mirror element on the associated base element.

Furthermore, actuators of an actuator system can be arranged there for producing movements of the mirror element in relation to the base element as a reaction to the reception of control signals. It is possible in this way to set different orientations of the individual mirror surfaces in a targeted manner. Furthermore, sensors of a sensor system can be arranged in the intermediate space in order to capture the respective position or orientation of the mirror surfaces in relation to the base element.

By arranging these mechanical and electromechanical components in the intermediate space, a large proportion of the area of the reflective facets of the total area of the MMA, that is to say a large fill factor, can be attained. In order to attain a high integration density, it is possible to use in the manufacturing process technologies from the field of producing micro-electromechanical systems (MEMS, for short) to produce actuator elements (elements of the actuator system), mechanical elements (for example elements of the suspension system), and/or sensor elements or the like. The suspension system can be flexibly designed for example in mirror units with MEMS structures in a manner such that it provides restoring forces that result in a mirror element automatically assuming a zero position without tilt in the absence of actuator forces. MEMS processes nowadays are based substantially on structuring processes in which workpieces made of silicon or a silicon compound are structured and in this way the components are designed.

The inventors have recognized that certain known approaches, such as approaches that are based on capacitive actuator systems (such as US 2017/363861 A1), can involve a relatively large amount of installation space for the actuator systems, which can result in correspondingly less installation space for the sensor systems and consequently a tendency to a lower sensitivity. Furthermore, capacitive actuator systems that may possibly provide the actuator torques used for attaining large tilt angles appear to involve relatively complex setups that have several levels with electrode combs and consequently consist of many layers and involve a corresponding number of process steps. Concepts involving capacitive actuator systems can also place high demands on process technology, for example if high aspect ratios of the structures are produced in order to satisfy typical desired properties relating to the use in EUV lithography apparatuses.

For these reasons, among others, the disclosure provides a piezoelectric actuator system, that is to say an actuator system having piezoelectric actuators, which in this application are also referred to as piezo actuators for short. A piezoelectric actuator system can be produced with compact overall dimensions and produce relatively high forces and moments in relation to the construction size. It thus can become possible to set relatively large tilt angles even if the suspension system is designed such that it produces restoring forces in order to move the mirror element into its zero position when there are no actuator forces. After all, the restoring forces in resilient suspension systems increase as the tilt angle increases, and so an actuator works against increasing counterforces in order to set greater tilt angles.

A piezo actuator has at least one piezo element, that is to say a controllable functional element that utilizes the piezo effect in order to perform a mechanical movement due to the application of an electrical voltage. A piezo actuator here utilizes what is known as the inverse piezo effect. Piezo elements can be specific crystals (piezo crystals) or piezoelectric ceramics, that is to say polycrystalline materials.

By contrast, according to the findings, capacitively operating sensor systems can be undesirable for sensor systems, for example in terms of producibility and performance. The sensor system can have, for example, capacitive sensor elements with at least one comb electrode. A sensor element can comprise comb electrodes with alternately intermeshed electrode plates. Electrode combs of a capacitive sensor system can be implemented for example on the lower side of the mirror element and the upper side of the base element. It is thus possible to attain relatively large sensitivities, since (due to the small space used for the piezoelectric actuator systems) the available installation space for the sensor systems can be relatively large and can additionally be located in the outer regions of the mirror where the mirror movement upon tilting is the greatest. Moreover, a capacitive sensor can have (in contrast to, for example, piezoresistive sensors) merely a low temperature sensitivity.

Therefore, according to the disclosure, a capacitively operating sensor system, that is to say a sensor system having capacitively operating sensors, is used in combination with the piezoelectrically operating actuator system. A capacitive sensor is a sensor that operates on the basis of the change in the electrical capacitance of an individual capacitor or of a capacitor system. Optionally, all actuators of the actuator system are piezo actuators and/or all sensors of the sensor system are capacitive sensors.

The suspension system mechanically connects the mirror substrate to the base element. The suspension system can have, for example, resilient and/or flexible portions or components which provide the desired movability. The suspension system can contain articulations that connect the components or portions of the former to one another in an articulated manner, for example in the form of flexures.

The actuator system can be a system that is constructed independently of the suspension system and provides forces and torques for the movement of the mirror elements. The suspension system can be designed free from actuators as a passive system.

In some embodiments, by contrast, the suspension system and the actuator system are integrated. This can be accomplished by portions of the suspension system also acting as functional parts of the actuator system, that is to say as actuators, and thus having a dual function. Components of the sensor system can likewise be integrated. For example, there is the possibility of integrating piezoresistive sensors into spring elements whose electrical resistance changes depending on the deformation of the spring element. Piezoresistive sensors can be highly sensitive to temperatures, however.

In order to be able to implement the drive, sensor and mechanical elements with technologies from the field of producing micromechanical systems (MEMS), a layer-type structure of these elements is typically chosen. In order to achieve sufficient lift for changes in the location of the mirror elements, a piezoelectric actuator can be designed as a multilayer piezo actuator in the form of a piezo stack, wherein electrode layers lie between individual piezoelectric layers and the arrangement is configured such that, when an electrical voltage is applied, the thickness of the piezoelectric layers and consequently the spacing between the electrodes changes. If a multiplicity of piezoelectric layers arranged one above the other are chosen, greater lifts can be achieved.

In some embodiments, a piezoelectric actuator is embodied in the form of a multilayer bending piezo actuator. The latter will also be referred to below simply as bending piezo actuator. A bending piezo actuator can be configured such that it adopts a neutral shape in the absence of control voltages, for example in a manner such that all layers which are arranged one above the other are substantially planar so that the piezo actuator as a whole forms a planar structure. The longitudinal direction of the actuator extends between the linking sites at the ends of the actuator. Located between the upper side and lower side of the actuator is a (virtual) neutral layer, that is to say a layer whose longitudinal extent does not change when the bending piezo actuator bends. A bending line whose profile in the non-actuated neutral state can be straight extends in the longitudinal direction in the neutral layer.

If an electrical voltage is applied between the upper side and lower side of a piezo layer, the bending piezo actuator forms a bend between the linking sites such that the bending line becomes curved. The cross section of the actuator located perpendicularly to the bending line optionally does not change in the process. The application of the voltage thus produces a planar bend in which the profile of the bending line at different curvatures always lies in the same plane (bending plane). As a result, the elements linked to the linking sites are pivoted with respect to one another, specifically primarily about a virtual rotary actuation axis extending perpendicular to the bending plane in which the bending line is located.

In the case of a pure tilt movement, the actuation axis lies fixedly in space independently of the tilt state. However, generally no "perfect" rotation of the mirror element about a fixed rotational axis is produced in the case of a tilt which is enabled by a bending piezo actuator. Typically, minor parasitic movements of the mirror element to the side and upward/downward additionally occur. However, for the purposes of this application, it is sufficient to describe the tilt movement as a rotation about an actuation axis.

A multilayer bending piezo actuator within the meaning of this application has a multilayer structure with at least one piezoelectric layer and one further layer, wherein, at opposite sides of the piezoelectric layer, in each case one electrode layer for producing an electrical field penetrating the piezoelectric layer in the thickness direction is arranged and the piezoelectric layer is designed such that, when an electrical voltage is applied to the electrode layers, the piezoelectric layer contracts in the direction of the layer extent, resulting in bending of the multilayer structure.

The piezoelectric layer can comprise (or consist of) a piezoelectric ceramics material, such as selected from the group comprising lead zirconate titanate (PZT), lithium niobate, potassium niobate, sodium niobate, PMN-PT, barium titanate, lead titanate, quartz (=silicon oxide), zinc oxide, aluminum nitride. Lead zirconate titanate, that is to say a PZT ceramic is an example of a piezoelectric ceramic material.

The further layer is intended to be elastically deformable or bendable to a limited extent. It can be a carrier layer made of a non-piezoelectric material. The carrier layer can comprise (or consists of) silicon or a silicon compound, which for example in the case of Si-based MEMS structures can be achieved particularly easily in terms of production. A multilayer bending actuator in which a single piezoelectric active layer is combined with an inactive layer, for example a carrier layer consisting of a non-piezoelectric material, is also referred to here as unimorph or monomorph, because active bending is produced only in one direction.

It is also possible that the further layer is a further piezoelectric layer, wherein a common electrode layer can be arranged between the piezoelectric layers. The piezoelectric layers can now be controlled independently of one another such that bending in two opposite directions can be actively produced. Such structures will be referred to here as bimorph.

It is possible that two piezoelectric layers are separated merely by an interposed common electrode layer. However, the multilayer structure can also be such that a carrier layer made of a non-piezoelectric material, such as silicon, is provided, wherein a piezoelectric layer is arranged in each case on both sides of the carrier layer. Bidirectional deflection is also possible here.

If the particularly high forces and moments for the displacement of mirror elements are used, it is also possible for the piezoelectric actuator to have three or more piezoelectric layers, such as four, five or six piezoelectric layers, which are controllable independently of one another. In this way, higher actuator forces can be realized.

A piezoelectric actuator can be designed in terms of its proportions such that its longitudinal dimensions (dimensions measured in the longitudinal direction or along the bending line) are greater than the dimensions transversely thereto, that is to say in the width direction and height direction. In this way, relatively large travels between a fixedly linked end and a movable end of the actuator can be realized even in the case of small curvatures of the piezo actuator. In some embodiments, however, proportions that deviate therefrom are selected. For example, it may be the case that a piezoelectric actuator has, orthogonally to a bending line, an optionally rectangular cross section with an aspect ratio of greater than 1 between its width and its height, wherein the width in turn is greater than a length effective along the bending line.

With this short, wide shape, increasing thermal loads on EUV multi-mirror arrangements can be addressed, among other things. In order to be able to manage a high thermal load, it is considered to be desirable to design the actuator and linking elements such that, in summation, they have the lowest possible thermal resistance, with the result that sufficient dissipation of heat through the MEMS structure to the carrier element can be ensured and overheating of the elements of the mirror units can thereby be avoided. One contribution to achieving a low thermal resistance is to choose the cross-sectional area of the connection elements and the actuator elements to be as large as possible. In addition, comparatively wide actuator elements are advantageous, since they reduce the thermal resistance and at the same time do not negatively impact the maximum tilt angle.

As already mentioned, the suspension system and the actuator system can be integrated in a way such that portions of the suspension system are embodied as piezoelectric actuator of the actuator system. According to one refinement, this is implemented by the suspension system having at least one connection element group for mechanically connecting the base element to the mirror substrate, wherein the connection element group has two piezoelectric actuators which are controllable independently of each other and have mutually orthogonal rotary actuation axes. The piezo actuators can be designed as multilayer bending actuators of the type described above.

The suspension system can have, for mechanically connecting the base element to the mirror substrate, two connection element groups with in each case two integrated piezoelectric actuators which are controllable independently of each other and have mutually orthogonal rotary actuation axes, wherein each of the connection groups has (i) a base linking element fixedly linked to the base element, (ii) a first piezoelectric actuator that is attached with one end to the base linking element and with an opposite end to a flexurally stiff connection element, (iii) the flexurally stiff connection element, and (iv) a second piezoelectric actuator that is attached with one end to the flexurally stiff connection element and with an opposite end to (v) a mirror linking element that is fixedly connected to the mirror element.

In a variant of the connection element group, the two piezoelectric actuators, which are arranged with a distance between them and are connected to each other via a rigid connection element, in each case form flexures between the interposed connection element and the linked components (base element and mirror element). However, while typical flexures are passive and change their shape in dependence on the relative orientation of the linked components, the opposite is the case with this arrangement, since the relative positioning of the respectively linked components is actively specified or forced by way of controlling the piezoelectric actuators.

The flexurally stiff connection elements create a geometrically defined connection, which does not change its shape even under the action of force and is rigid to this extent, between the two linked piezoelectric actuators whose ends facing away from the connection element are attached on one side to the base element and on the other side to the mirror element. One property of such arrangements is the direct conversion of the tilt angle at the end of an actuator element into the tilt angle of the mirror element. This achieves effective conversion of the bending of the piezoelectric actuator element into a tilt of the mirror. The extent of the tilt can be specified precisely by controlling the piezoelectric actuators and is exclusively dependent on the control voltages. The effect on the tilt position of the mirror elements is direct here, and does not take place via levers.

In a suspension system having the two multiply articulated connection element groups with integrated piezo actuators, the first piezoelectric actuators can define first rotary actuation axes and can be embodied and arranged such that the first rotary actuation axes are aligned substantially coaxially to one another, and the second piezoelectric actuators define second rotary actuation axes and are embodied and arranged such that the second rotary actuation axes are aligned substantially coaxially to one another and orthogonally to the first rotary actuation axes. Such an arrangement of the actuator elements makes tilting of a linked mirror element about two axes in each case in a positive and negative direction possible. By operating multiple actuators at the same time, combinations of mirror tilts about the mutually orthogonal axes can be realized such that a total two-dimensional tilt field can be set.

Flexible suspension systems that, similar to a gimbal, allow rotations about two mutually orthogonal axes are also referred to occasionally in specialist circles as "Cardan" or Cardan suspension systems.

If one neglects, in the interest of a short and concise designation, that a suspension system of the type described above having the two multiply articulated connection element groups also permits parasitic relative movements between the mirror element and base element in addition to the rotations about two mutually orthogonal actuation axes, this suspension system can also be described as "Cardan." In contrast to a (passive) cardan suspension, however, this suspension system is actively controllable due to the integrated piezo actuators, since the shape of the actuable portions and consequently the spatial arrangement of its components can be modified in a targeted manner.

In some embodiments, a piezoelectric actuator designed as a multilayer bending piezo actuator has a mirror-side end portion that is linked to an attachment surface of the mirror element directly or via a mirror linking element rigidly connected to the mirror-side end portion with the aid of a rigid link. Rigid linking means non-articulated linking that creates a fixed angle relation between the end portion and the mirror element. Unlike in the case of a lever connection or another type of articulated connection, the angle relation does not change in dependence on the tilt angle. The rigid link can be designed such that the mirror surface in each bending position of the piezoelectric actuator is aligned tangentially or parallel or almost parallel to the mirror-side end portion. This allows a flat construction in a narrow intermediate space while at the same time large maximum tilt angles are attainable.

According to refinement, a capacitive sensor of the sensor system comprises at least one sensor element in the form of a comb electrode, that is to say an electrode having a multiplicity of electrode plates or plate-type electrode fingers which are arranged one next to the other with a mutual distance, similar to the tines of a comb.

In some embodiments, pairs of mutually assigned comb electrodes with alternately intermeshing electrode plates are provided. The comb electrodes of one pair can be formed or arranged on the lower side of the mirror element and on the upper side of the base element. Intermeshing comb elec- trodes form an electrical capacitor, whose capacitance changes as the tilt position of the mirror elements changes. Possible examples of the position and alignment of comb electrodes in mirror units having capacitive actuators and capacitive sensors are provided in DE 10 2015 204 874 A1 (in accordance with US 2017/363861 A1). The disclosure content of that application with regard to the sensors is incorporated by reference in the content of the present description.

In a capacitive sensor having two mutually assigned comb electrodes with alternately intermeshing electrode plates, both comb electrodes of one pair are electrically connected to a voltage source and are at different electrical potentials. As an alternative, at least one capacitive sensor may be provided that has a comb electrode, connected to a voltage source, having electrode plates that are arranged in the manner of a comb and are electrically insulated from one another. The electrical interconnection is designed such that respectively adjacent electrode plates are at different poten- tials, with the result that an electrical field can build up between adjacent electrode plates. Such a comb electrode consequently has during operation a multiplicity of mutually adjacent capacitors or capacitances. Provided as a counter- part is an electric comb element with plates that are arranged at a distance from one another and engage in each case in an intermediate space between adjacent electrode plates of the assigned comb electrode. The capacitances of the capacitors of the comb electrode that are formed by pairs of adjacent electrode plates change depending on the penetration depth of the (electrically passive) plates. The comb element can be electrically passive, and so a connection to a voltage source can be dispensed with. However, the combs that serve for shielding are typically kept at a defined electrical potential to prevent charging due to the EUV-generated plasma.

All the capacitive sensors of the sensor system can be constructed and operate in accordance with one of these two possibilities. It is also possible to combine both types.

The sensor elements of capacitive sensors can be arranged in radially outer regions of the mirror unit. Electrode plates of comb electrodes and/or plates of comb elements can extend up to the outer periphery of the mirror substrate and/or of the base element.

The comb electrodes and/or plates can be arranged in rectangular, for example square, corner regions of the base element and the mirror element. These can be kept free by the rigid connection elements having an angular shape with narrow legs. The spatial arrangement of the intermeshing plates or fingers can vary depending on the embodiment. In some embodiments, the plates or fingers are aligned radially to a center of the mirror element. In other embodiments, arcuately curved plates are arranged concentrically to the center. The interacting plates can also extend in a rectilinear or planar manner at equal lateral distances from one another. The orientation can be parallel to a radial direction or perpendicular to a radial direction. The plates or combs of in each case diagonally opposite combs can extend parallel to one another, wherein in another diagonal the orientation is perpendicular thereto. It is also possible to design electrode plates to be angular.

The disclosure also relates to an illumination system for an EUV apparatus, wherein the illumination system is embodied to receive, during operation of the EUV appara- tus, EUV radiation from an EUV radiation source and to shape, from at least one portion of the received EUV radiation, illumination radiation that is directed into an illumination field in an exit plane of the illumination system. The illumination system has at least one EUV multi-mirror arrangement of the type described in this application.

The EUV apparatus can be, for example, a projection exposure apparatus for EUV microlithography or a mask inspection apparatus, employing EUV radiation, for inspect- ing masks (reticles) for EUV microlithography.

Individual mirror units having a base element, mirror element and the interposed components of the suspension system, of the actuators and sensors can also be used independently of the use in an MMA, for example as electrically controllable switching element in an optical circuit. Also disclosed to this extent is an individual mirror unit having at some of the associated features from an MMA disclosed herein.

BRIEF DESCRIPTION OF THE DRAWINGS

Further features and aspects of the disclosure are evident from the claims and from the description of exemplary embodiments of the disclosure, which will be explained below with reference to the figures.

DETAILED DESCRIPTION

Figure 1:
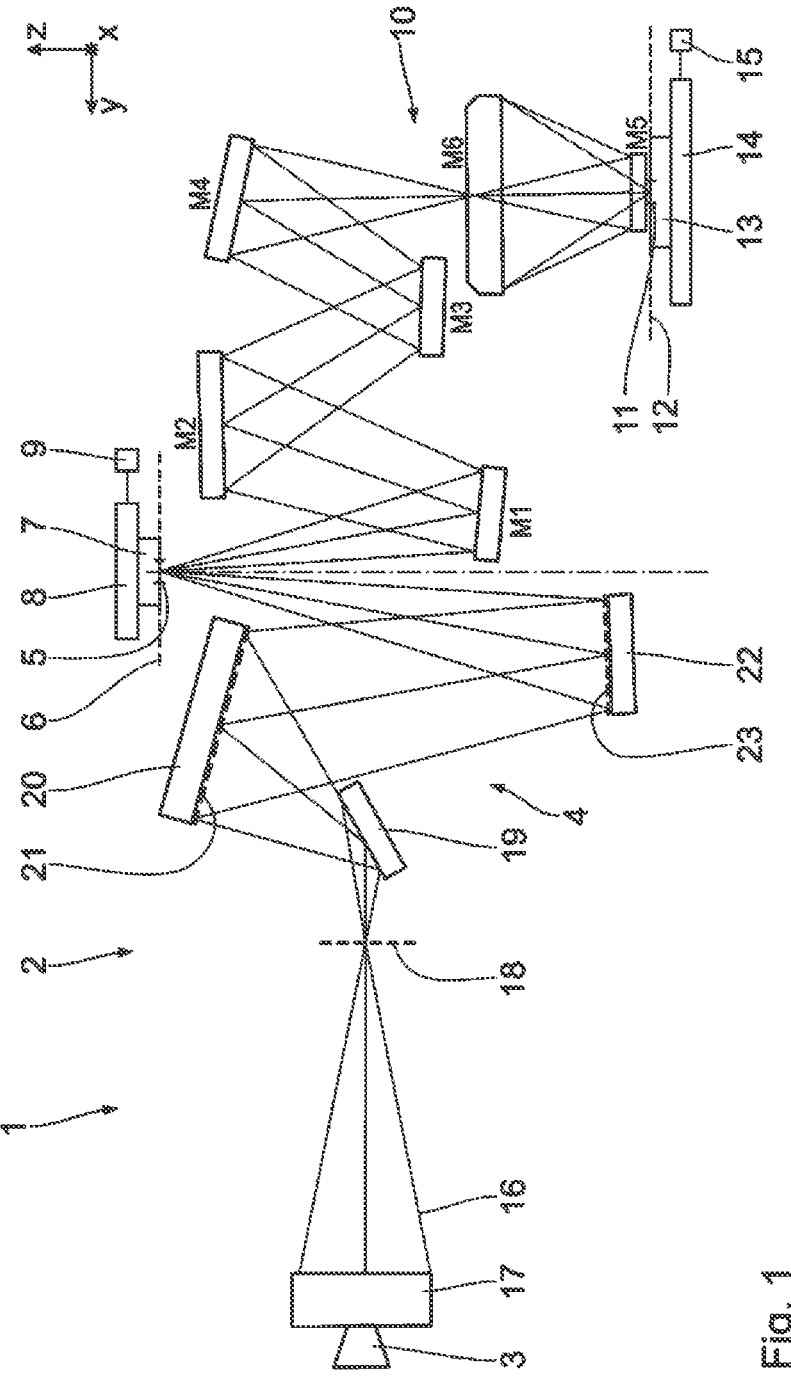
FIG. 1 schematically shows optical components of an EUV microlithography projection exposure apparatus hav- ing an illumination system containing one or more EUV multi-mirror arrangements according to one exemplary embodiment.

Examples of configurations of EUV mirror arrangements will be explained by way of examples below with reference to possible uses in EUV apparatuses in the field of micro- lithography.

In the following text, certain components of a microlithographic projection exposure apparatus 1 are described first by way of example with reference to FIG. 1. The description of the basic construction of the projection exposure apparatus 1 and its components should not be understood here as limiting.

An illumination system 2 of the projection exposure apparatus 1 has, besides a radiation source 3, an illumination optical unit 4 for the illumination of an object field 5 in an object plane 6. Here, a reticle 7 arranged in the object field 5 is exposed. The reticle 7 is held by a reticle holder 8. The reticle holder 8 is displaceable by way of a reticle displacement drive 9, for example in a scanning direction.

A Cartesian xyz-coordinate system is shown in FIG. 1 for explanation purposes. The x-direction runs perpendicular to the plane of the drawing into the latter. The y-direction runs horizontally and the z-direction runs vertically. The scanning direction runs along the y-direction in FIG. 1. The z-direction runs perpendicular to the object plane 6.

The projection exposure apparatus 1 comprises a projection optical unit 10. The projection optical unit 10 serves for imaging the object field 5 into an image field 11 in an image plane 12. The image plane 12 extends parallel to the object plane 6. Alternatively, an angle between the object plane 6 and the image plane 12 that differs from 0° is also possible.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15 for example along the y-direction. The displacement on the one hand of the reticle 7 by way of the reticle displacement drive 9 and on the other hand of the wafer 13 by way of the wafer displacement drive 15 can take place in such a way as to be synchronized with one another.

The radiation source 3 is an EUV radiation source. The radiation source 3 emits, for example, EUV radiation 16, which is also referred to below as used radiation or illumination radiation. For example, the used radiation has a wavelength in the range of between 5 nm and 30 nm. The radiation source 3 can be a plasma source, for example an LPP ("laser produced plasma") source or a GDPP ("gas discharged produced plasma") source. It can also be a synchrotron-based radiation source. The radiation source 3 can be a free electron laser (FEL).

The illumination radiation 16 emerging from the radiation source 3 is focused by a collector 17. The collector 17 can be a collector with one or more ellipsoidal and/or hyperboloidal reflection surfaces. The illumination radiation 16 can be incident on the at least one reflection surface of the collector 17 with grazing incidence (GI), that is to say at angles of incidence of greater than 45°, or with normal incidence (NI), that is to say at angles of incidence of less than 45°. The collector 17 can be structured and/or coated, firstly, for optimizing its reflectivity for the used radiation and, secondly, for suppressing extraneous light.

Downstream of the collector 17, the illumination radiation 16 propagates through an intermediate focus in an intermediate focal plane 18. The intermediate focal plane 18 can represent a separation between a radiation source module, having the radiation source 3 and the collector 17, and the illumination optical unit 4.

The illumination optical unit 4 comprises a deflection mirror 19 and, arranged downstream thereof in the beam path, a first facet mirror 20. The deflection mirror 19 can be a plane deflection mirror or, alternatively, a mirror with a beam-influencing effect that goes beyond the purely deflecting effect. As an alternative or in addition thereto, the mirror 19 can be embodied as a spectral filter separating a used light wavelength of the illumination radiation 16 from extraneous light having a wavelength that deviates therefrom. If the first facet mirror 20 is arranged in a plane of the illumination optical unit 4 which is optically conjugate to the object plane 6 as a field plane, this facet mirror is also referred to as a field facet mirror. The first facet mirror 20 comprises a multiplicity of individual first facets 21, which are also referred to below as field facets. FIG. 1 depicts only some of said facets 21 by way of example.

The first facets 21 can be in the form of macroscopic facets, for example in the form of rectangular facets or in the form of facets with an arcuate peripheral contour or a peripheral contour of part of a circle. The first facets 21 may be in the form of plane facets or alternatively in the form of convexly or concavely curved facets.

As is known for example from DE 10 2008 009 600 A1, the first facets 21 themselves can themselves also be composed in each case of a multiplicity of individual mirrors, for example a multiplicity of micromirrors. The first facet mirror 20 can for example be embodied in the form of a microelectromechanical system (MEMS system). For details, reference is made to DE 10 2008 009 600 A1.

The illumination radiation 16 travels horizontally, that is to say along the y-direction, between the collector 17 and the deflection mirror 19.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 can also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1, and U.S. Pat. No. 6,573,978.

The second facet mirror 22 comprises a plurality of second facets 23. In the case of a pupil facet mirror, the second facets 23 are also referred to as pupil facets.

The second facets 23 can likewise be macroscopic facets, which can for example have a round, rectangular or hexagonal boundary, or can alternatively be facets composed of micromirrors. In this regard, reference is likewise made to DE 10 2008 009 600 A1.

The second facets 23 can have plane or alternatively convexly or concavely curved reflection surfaces.

The illumination optical unit 4 consequently forms a doubly faceted system. This fundamental principle is also referred to as a fly's eye condenser (fly's eye integrator).

It can be advantageous to arrange the second facet mirror 22 not exactly in a plane that is optically conjugate to a pupil plane of the projection optical unit 7.

With the aid of the second facet mirror 22, the individual first facets 21 are imaged into the object field 5. The second facet mirror 22 is the last beam-shaping mirror or actually the last mirror for the illumination radiation 16 in the beam path upstream of the object field 5.

In a further embodiment, not shown, of the illumination optical unit 4, a transfer optical unit contributing for example to the imaging of the first facets 21 into the object field 5 can be arranged in the beam path between the second facet mirror 22 and the object field 5. The transfer optical unit can have exactly one mirror, or alternatively have two or more mirrors, which are arranged one behind the other in the beam path of the illumination optical unit 4. The transfer optical unit can for example comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the field facet mirror 20 and the pupil facet mirror 22.

The deflection mirror 19 can also be dispensed with in a further embodiment of the illumination optical unit 4, and so the illumination optical unit 4 can then have exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is, as a rule, only approximate imaging.

The projection optical unit 10 comprises a plurality of mirrors Mi, which are consecutively numbered in accordance with their arrangement in the beam path of the projection exposure apparatus 1.

In the example illustrated in FIG. 1, the projection optical unit 10 comprises six mirrors M1 to M6. Alternatives with four, eight, ten, twelve or any other number of mirrors Mi are likewise possible. The penultimate mirror M5 and the last mirror M6 each have a through opening for the illumination radiation 16. The projection optical unit 10 is a double-obscured optical unit. The projection optical unit 10 has an image-side numerical aperture which is greater than 0.5 and which can also be greater than 0.6 and, for example, can be 0.7 or 0.75.

Reflection surfaces of the mirrors Mi can be embodied as free-form surfaces without an axis of rotational symmetry. Alternatively, the reflection surfaces of the mirrors Mi can be designed as aspheric surfaces with exactly one axis of rotational symmetry of the reflection surface shape. Just like the mirrors of the illumination optical unit 4, the mirrors Mi can have highly reflective coatings for the illumination radiation 16. These coatings can be designed as multilayer coatings, for example with alternating layers of molybdenum and silicon.

The projection optical unit 10 has a large object-image offset in the y-direction between a y-coordinate of a center of the object field 5 and a y-coordinate of the center of the image field 11. This object-image offset in the y-direction can be of approximately the same magnitude as a z-distance between the object plane 6 and the image plane 12.

For example, the projection optical unit 10 can have an anamorphic embodiment. For example, it has different imaging scales $\beta_x$, $\beta_y$ in the x- and y-directions. The two imaging scales $\beta_x$, $\beta_y$ of the projection optical unit 7 can lie at ($\beta_x$, $\beta_y$)=(+/−0.25, +/−0.125). A positive imaging scale $\beta$ means imaging without image inversion. A negative sign for the imaging scale $\beta$ means imaging with image inversion.

The projection optical unit 7 consequently leads to a reduction in size with a ratio of 4:1 in the x-direction, that is to say in a direction perpendicular to the scanning direction.

The projection optical unit 10 leads to a reduction in size of 8:1 in the y-direction, that is to say in the scanning direction.

Other imaging scales are likewise possible. Imaging scales with the same sign and the same absolute value in the x-direction and y-direction are also possible, for example with absolute values of 0.125 or of 0.25.

The number of intermediate image planes in the x-direction and in the y-direction in the beam path between the object field 5 and the image field 11 can be the same or, depending on the embodiment of the projection optical unit 10, can differ. Examples of projection optical units with different numbers of such intermediate images in the x- and y-directions are known from US 2018/0074303 A1.

In each case one of the pupil facets 23 is assigned to exactly one of the field facets 21 for forming in each case an illumination channel for illuminating the object field 5. For example, this can yield illumination according to the Köhler principle. The far field is decomposed into a multiplicity of object fields 5 with the aid of the field facets 21. The field facets 21 produce a plurality of images of the intermediate focus on the pupil facets 23 respectively assigned thereto.

By way of an assigned pupil facet 23, the field facets 21 are imaged in each case onto the reticle 7 in a manner superposed on one another for the purposes of illuminating the object field 5. The illumination of the object field 5 is for example as homogeneous as possible. It can have a uniformity error of less than 2%. The field uniformity can be achieved by way of the overlay of different illumination channels.

The illumination of the entrance pupil of the projection optical unit 10 can be defined geometrically by way of an arrangement of the pupil facets. The intensity distribution in the entrance pupil of the projection optical unit 10 can be set by selecting the illumination channels, for example the subset of the pupil facets which guide light. This intensity distribution is also referred to as illumination setting.

A likewise preferred pupil uniformity in the region of portions of an illumination pupil of the illumination optical unit 4 which are illuminated in a defined manner can be achieved by a redistribution of the illumination channels.

Further aspects and details of the illumination of the object field 5 and for example of the entrance pupil of the projection optical unit 10 are described below.

For example, the projection optical unit 10 can have a homocentric entrance pupil. The latter can be accessible. It can also be inaccessible.

The entrance pupil of the projection optical unit 10 cannot regularly be exactly illuminated using the pupil facet mirror 22. In the case of imaging of the projection optical unit 10 which telecentrically images the center of the pupil facet mirror 22 onto the wafer 13, the aperture rays often do not intersect at a single point. However, it is possible to find an area in which the distance of the aperture rays determined in pairs becomes minimal. This area represents the entrance pupil or an area in real space that is conjugate thereto. For example, this area has a finite curvature.

It may be the case that the projection optical unit 10 has different poses of the entrance pupil for the tangential beam path and for the sagittal beam path. In this case, an imaging element, for example an optical component element of the transfer optical unit, should be provided between the second facet mirror 22 and the reticle 7. With the aid of this optical element, the different poses of the tangential entrance pupil and the sagittal entrance pupil can be taken into account.

In the arrangement of the components of the illumination optical unit 4 illustrated in FIG. 1, the pupil facet mirror 22 is arranged in an area conjugate to the entrance pupil of the projection optical unit 10. The field facet mirror 20 is arranged such that it is tilted with respect to the object plane 5. The first facet mirror 20 is arranged in tilted fashion with respect to an arrangement plane defined by the deflection mirror 19.

The first facet mirror 20 is arranged such that it is tilted with respect to an arrangement plane that is defined by the second facet mirror 22.

The EUV radiation is incident on both facet mirrors 20, 22 at a defined angle of incidence. The two facet mirrors are operated here at "normal incidence" or nearly "normal incidence," for example with angles of incidence from an incidence angle range of, for example, ±25° around a main direction of incidence HE, which extends perpendicularly to the global mirror normal NOR.

Figures 2, 3:
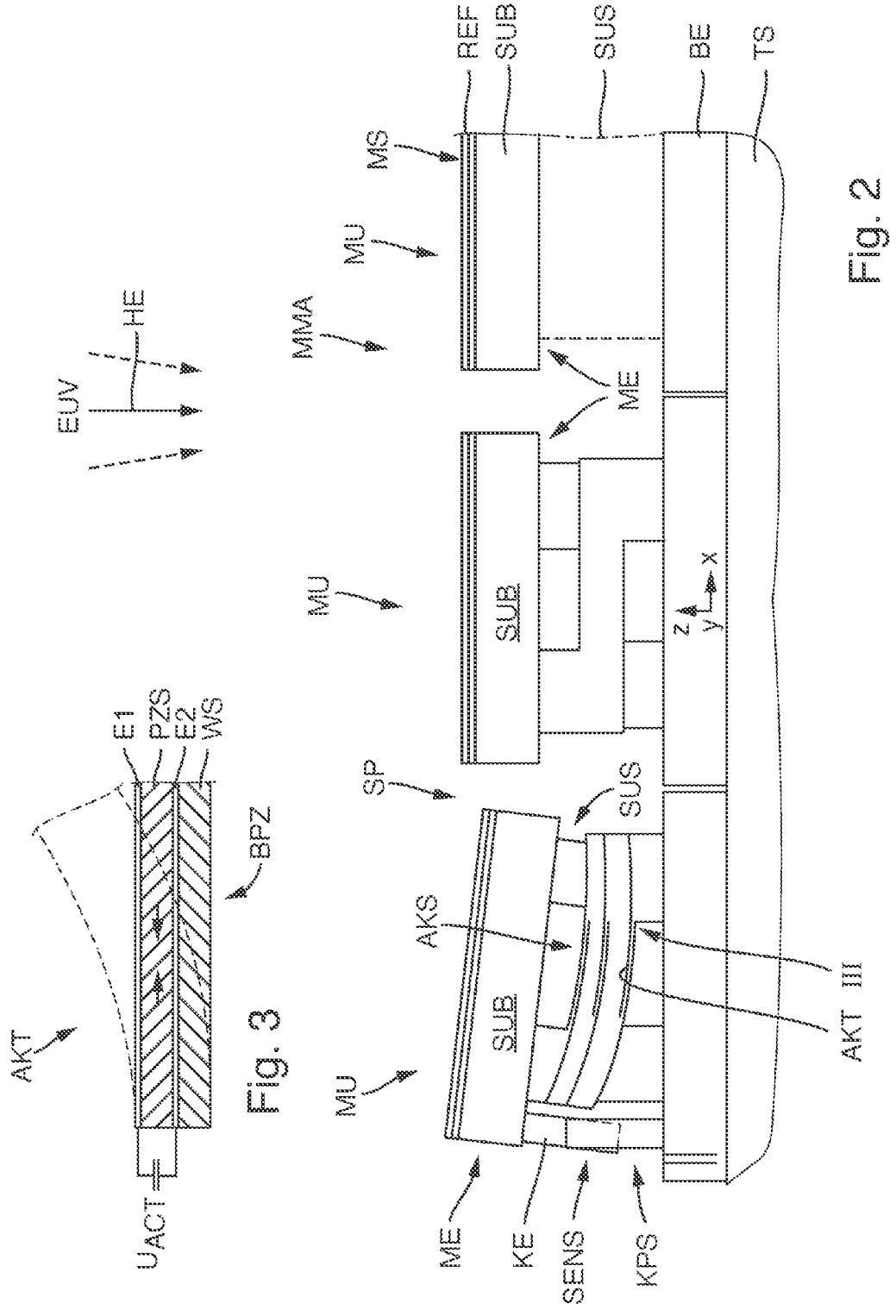
FIG. 2 schematically shows a detail of a controllable EUV multi-mirror arrangement in the form of multi-mirror arrays or a facet mirror according to one exemplary embodiment.
FIG. 3 shows a schematic section through the layer structure of an exemplary piezoelectric bending actuator from the region III in FIG. 2.
Figure 4:
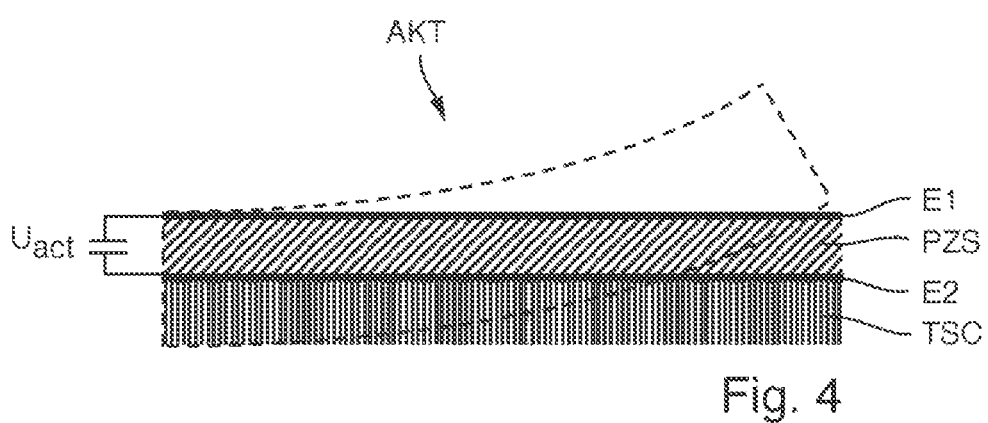
FIGS. 4 to 6 show variants of bending piezo actuators having a plurality of layers of different functions which are arranged one above the other, wherein at least one layer is a piezoelectric layer and the bending piezo actuators can bend as a reaction to the application of an electrical voltage.

The field facet mirror 20 and the pupil facet mirror 22 are examples of controllable EUV multi-mirror arrangements in the form of multi-mirror arrays (MMA). With reference to FIG. 2, an example of a construction of such an EUV multi-mirror arrangement according to one exemplary embodiment (here: field facet mirror) will be explained in more detail.

The EUV multi-mirror arrangement MMA has a multiplicity of mirror units MU which are arranged one next to the other in a matrix-type two-dimensional grid arrangement in rows and columns on a carrier structure TS. In the variant illustrated, the individual mirror units MU are arranged on a dimensionally stable carrier structure TS in the form of a base plate. Each of the mirror units MU has a base element BE mounted on the carrier structure and a mirror element ME, which is mounted via a flexible suspension system SUS so as to be individually movable relative to the base element BE.

In deviation from the illustration, the carrier structure and the base elements can be embodied in one piece from the same initial substrate in the form of a common structure. The carrier structure is then formed by the structurally contiguous base elements, which each correspond to a section of the initial substrate. A carrier structure that is separate from base elements is therefore not absolutely necessary.

In the case of the example, the mirror elements ME can be tilted individually in two rotational degrees of freedom relative to the associated base element BE. Each mirror element ME has a substantially plate-type mirror substrate SUB, which on its front face facing away from the base element BE has a reflection coating REF, which forms a mirror surface MS that is reflective for EUV radiation. The reflection coating has a multilayer structure with a plurality of pairs of layer material (for example Mo—Si), that are, in alternation, highly reflective and, relative thereto, low refractive, possibly with intermediate layers. The front face or the corresponding mirror surface MS can be planar or slightly concavely or convexly curved. Curved surfaces can be spherically or aspherically curved.

The mirror units MU are mounted so close to one another that the mirror surfaces MS are arranged one next to the other in a substantially area-filling manner. That means for example that the ratio of the sum of the mirror surfaces of the individual mirror elements ME to the total area of the mirror array that is occupied by mirror units, what is known as the integration density, is relatively high, for example greater than 0.7 or greater than 0.8 or greater than 0.9. Completely filling the area is not possible because in each case a gap SP delimited by way of side faces SF of the adjoining mirror substrates SUB remains between immediately adjacent mirror elements ME, through which a collision-free relative movement of the adjacent mirror elements relative to one another is ensured. The gap widths can lie, for example, in the order of a few 10 micrometers, for example in the range between 20 μm and 100 μm.

In each mirror unit MU, components of a flexible suspension system SUS which structurally connects the mirror element ME and the base element BE, creates a movable support for the mirror element relative to the base element with defined degrees of freedom, and provides restoring forces that lead to a mirror element automatically assuming a zero position without tilt in the absence of actuator forces (see central mirror element) are arranged between the mirror element ME and the base element BE.

Furthermore, components of a piezoelectric actuator system AKS for producing movements of the mirror element in relation to the base element as a reaction to the reception of control signals of the control device are arranged in the intermediate space between the mirror substrate and the base element. In the case of the example, they are integrated into the structure of the suspension system SUS, for example in the form of portions that are designed as bending piezo actuators BPZ with a plurality of layers having different functions arranged one above the other and that bend as a reaction to control signals (see exemplary embodiments in FIGS. 3 to 6). The piezo actuators (general reference AKT) are also simply referred to below as "actuator."

Furthermore, components (comb electrodes KE) of capacitive position sensors KPS of a capacitive sensor system SENS, with which the current relative position of the mirror element ME with respect to the base element BE can be captured and corresponding signals can be output to the control unit are present at the outer peripheral region of the mirror units. Closed-loop control of the individual tilt angles of the mirror substrates with respect to the carrier structure is thus ensured.

The tiltable mirror elements can be tilted around the zero position for example in a displacement range of ±50 mrad, for example ±100 mrad or more, and setting accuracies can be, for example, less than 0.2 mrad, for example less than 0.1 mrad.

The multi-mirror arrangement is produced to some extent by using technologies from the field of the production of micro-electromechanical systems (MEMS). In the example of FIG. 2, at least the base element BE, the suspension system SUS, the actuator system AKS, and the position sensor system SENS are embodied in the form of MEMS structures.

Various aspects of the suspension system SUS and the actuator system AKS will be explained below.

FIG. 3 shows by way of example a schematic section through the layer structure of an exemplary piezoelectric actuator AKT from the region III in FIG. 2 for explanatory purposes. This actuator has a multilayer structure with at least one piezoelectric layer PZS and a further layer WS made of a sufficiently elastic material. In each case one electrode layer E1, E2 is arranged at opposite sides of the piezoelectric layer PZS for producing an electrical field penetrating the piezoelectric layer in the thickness direction (perpendicular to the layer extent). The piezoelectric layer PZS consisting of a piezoelectrically active crystal material is designed such that, when an electrical voltage $U_{AKT}$ is applied to the electrode layers E1, E2, the piezoelectric layer contracts (see arrows) in the direction of the layer extent. This contraction leads to bending of the multilayer structure (see dashed line).

The further layer WS can be formed by a single layer or have a multilayer construction, in other words can again be divided into two or more layers. Variants will be explained in connection with FIGS. 4 to 6.

The piezoelectric layer PZS can be, for example, a polycrystalline ceramic layer, for example made of lead zirconate titanate (PZT). Lead-free ceramic materials are also conceivable. For thin-film MEMS, for example (K,Na) NbO_3 (potassium/sodium niobate) or AlN (aluminum nitride) can be used.

The piezo actuators themselves have one or more piezoelectric layers and possibly a non-piezoelectrically active carrier layer. In the unimorph piezo actuator AKT in FIG. 4, an individual piezoelectric layer PZS is located on a further layer in the form of a carrier layer TSC, which can consist of, for example, monocrystalline or polycrystalline silicon. In each case one electrode layer E1, E2 or a layer electrode is located on the upper side and lower side of the piezoelectric layer PZS. If an electrical voltage $U_{AKT}$ is applied between the two electrode layers, this results, as described above with respect to FIG. 3, in the entire actuator (carrier layer TSC and piezoelectric layer PZS and also electrode layers) bending in one plane (drawing plane).

Figure 5:
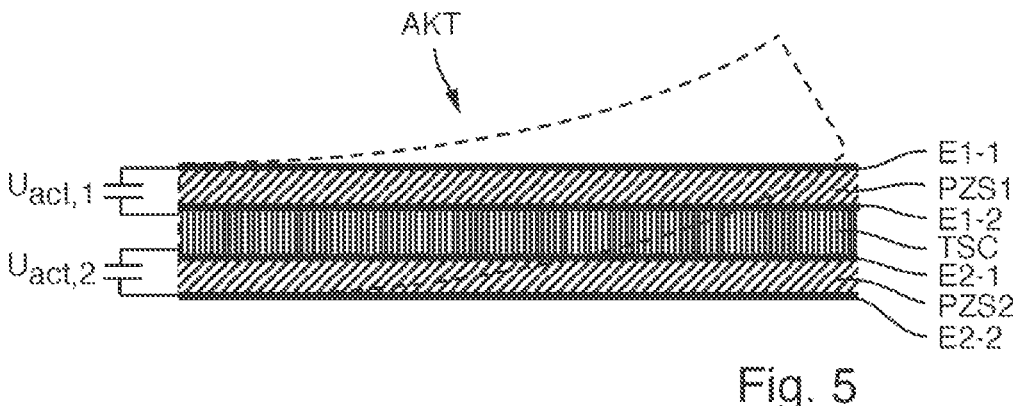

Some bimorph piezo actuators consist of a (passive) carrier layer TSC and two piezoelectric layers that are located on the upper side and the lower side of the carrier layer (see FIG. 5). In each case one electrode layer is located on the upper side and lower side of both piezoelectric layers. By applying a voltage between the two electrodes at a piezoelectric layer, the piezoelectric layer contracts in a direction parallel to the layer plane, which in turn brings about bending of the entire actuator (carrier layer, both piezoelectric layers and also electrode layers). If a voltage is applied between the two electrodes E1-1, E1-2 of the upper piezo layer PZS1, the entire actuator BPZ is deflected upwardly. If a voltage is applied between the two electrodes E2-1, E2-2 of the lower piezo layer PZS2, the entire actuator AKT is deflected downwardly.

Figure 6:
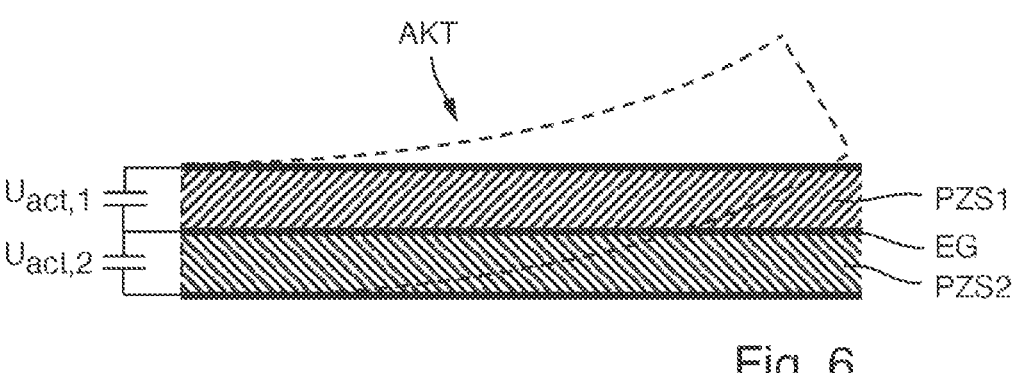

It is possible to implement an actuator without a carrier layer and to mount the two piezoelectric layers directly one above the other (cf. FIG. 6). The lower electrode of the upper piezo layer PZS1 and the upper electrode of the lower piezo layer PZS2 is implemented here by a common electrode EG between the two piezo layers. It is furthermore possible to also mount a plurality of piezo layers (for example 4 or 6) one above the other in order to increase the actuator force.

Figure 7:
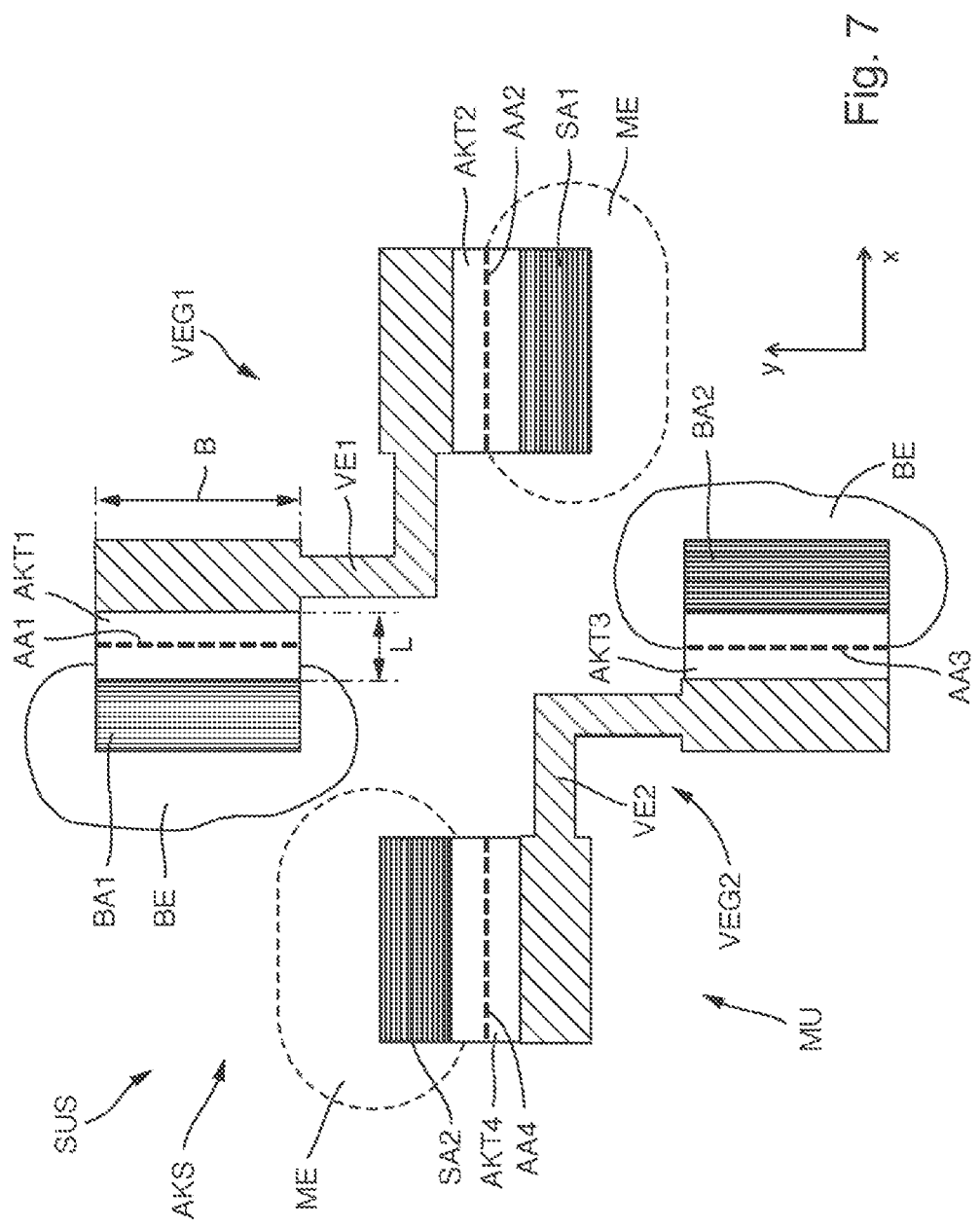
FIG. 7 schematically shows a top view of a mirror unit with a piezoelectric actuator system, whose piezo actuators are integrated into the suspension system disposed between the base element and mirror element.

With reference to FIG. 7, an actuator system AKS will be explained below, whose actuable components (actuators) are integrated in a suspension system SUS. FIG. 7 shows a plan view of a mirror unit MU in the z-direction; the base element BE and the mirror element ME (dashed line), which is arranged at a distance above the latter in the z-direction, are merely indicated. The components of the suspension system SUS and of the actuator system AKS or of the drive system are arranged therebetween in the z-direction. The actuator system AKS comprises exactly four individual piezo actuators AKT1, AKT2, AKT3, AKT4, which (in the non-actuated state) are all situated in the same plane. In each case two piezo actuators are assigned here to the mirror tilt about a specific axis. For example: The actuators AKT1 and AKT3 bring about a rotation of the mirror about the y-axis, the actuators AKT2 and AKT4 bring about a rotation of the mirror about the x-axis.

In the exemplary embodiment of FIG. 7, the four actuators AKT1, AKT2, AKT3, AKT4, the carrier-fixed base element BE, and the mirror element ME are interconnected via rigid connection elements VE1, VE2 as follows: The actuator AKT1 is connected on one side (via a base linking element BA1) to the fixed base element BE, and on another side (via the first connection element VE1) to the actuator AKT2. The actuator AKT2 is connected on one side (via VE1) to the actuator AKT1, and on another side via a mirror linking element SA1 to the mirror element ME that is to be tilted.

The elements BA1, AKT1, VE1, AKT2 and SA1, which are coupled together, form a first doubly articulated connection element group VEG1. The actuators AKT1, AKT2 are here actively bendable flexures, and the other components are rigid or flexurally stiff.

The actuator AKT3 is connected on one side (via a base linking element BA2) to the fixed base element BE, and on another side via the second connection element VE2 to the actuator AKT4. The actuator AKT4 is connected on one side (via VE2) to the actuator AKT3, and on another side (via a mirror linking element SA2) to the mirror element ME that is to be tilted.

The elements BA2, AKT3, VE2, AKT4 and SA2, which are coupled together, form a corresponding second doubly articulated connection element group VEG2. The actuators AKT3, AKT4 are here actively bendable flexures, and the other components are rigid.

The alignment of the actuator elements is selected such that the actuation axes AA1, AA3 of the actuators AKT1 and AKT3 are parallel, for example coaxial, to one another, and the actuation axes AA2, AA4 of the actuators AKT2 and AKT4 are parallel, for example coaxial, to one another. Furthermore, the actuation axes AA1, AA3 of the actuators AKT1 and AKT3 are orthogonal to the actuation axes AA2, AA4 of the actuators AKT2 and AKT4.

In the exemplary embodiment, a suspension system SUS, which has two multiply articulated connection element groups VEG1, VEG2 with in each case two integrated, independently controllable piezoelectric actuators with mutually orthogonal rotary actuation axes, is thus provided for mechanically connecting the base element BE to the mirror substrate or the mirror element ME. Each of the connection groups comprises a base linking element BA1, BA2 that is fixedly linked to the base element BE, attached thereto a first piezoelectric actuator, for example a multi-layer bending piezo actuator AKT1, AKT3, which is attached or linked with one end to the base linking element BA1, BA2 and with an opposite end to a flexurally stiff connection element VE1, VE2, the flexurally stiff connection element, a second piezoelectric actuator (for example multilayer bending piezo actuator) AKT2, AKT4, which is attached or linked with one end to the flexurally stiff connection element and with an opposite end to a mirror linking element SA1, SA2 that is fixedly connected to the mirror element ME.

Generally no "perfect" rotation of the mirror element about a fixed rotational axis or spatially fixed actuation axis is produced in the case of a tilt which is produced by a bending piezo actuator. Frequently, minor parasitic movements of the mirror element to the side and upward/downward additionally occur. The terms "orthogonal," "coaxial" etc. other should thus be understood to be approximate information for illustrating the principle.

Figure 8:
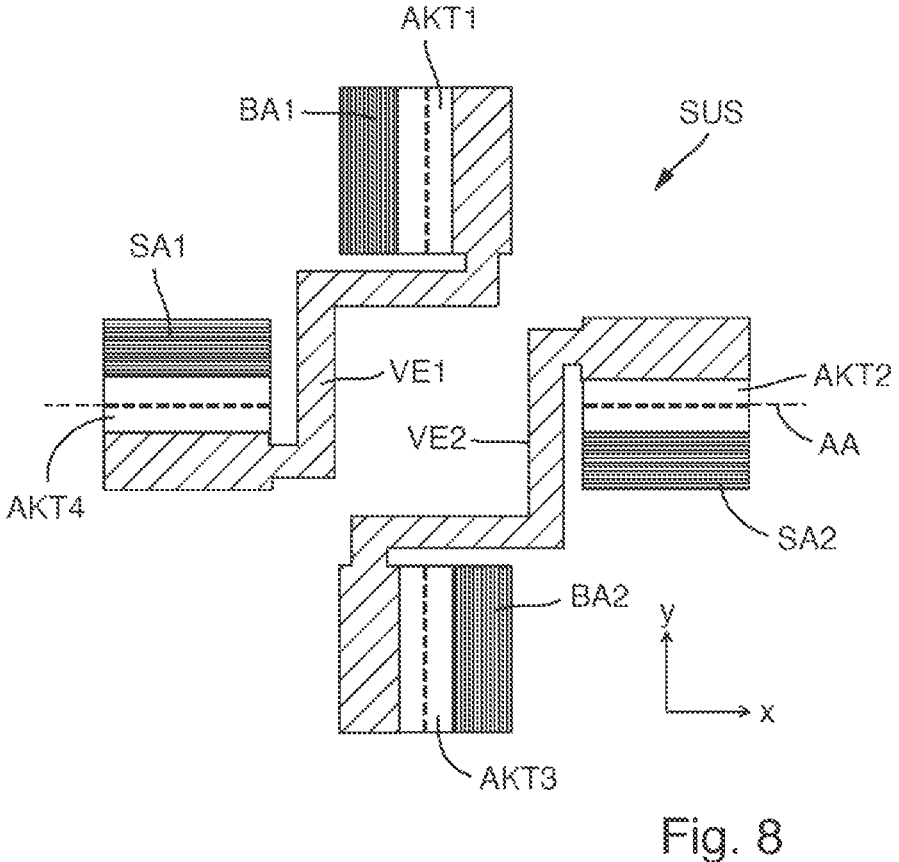
FIGS. 8, 10 and 11 show, in an illustration analogous to FIG. 7, different embodiments of suspension systems with integrated bending piezo actuators.
Figure 9:
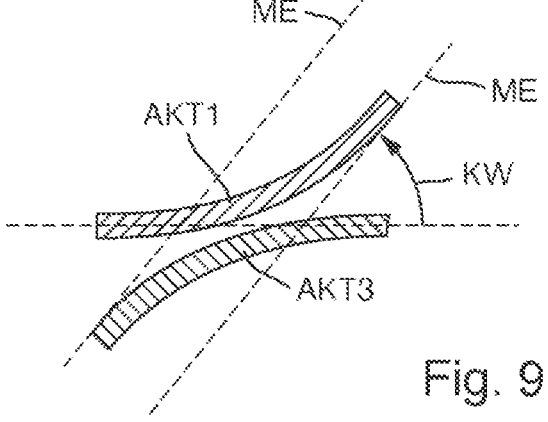
FIG. 9 shows a schematic side view of actuator elements that bend in opposite directions.
Figures 10, 11:
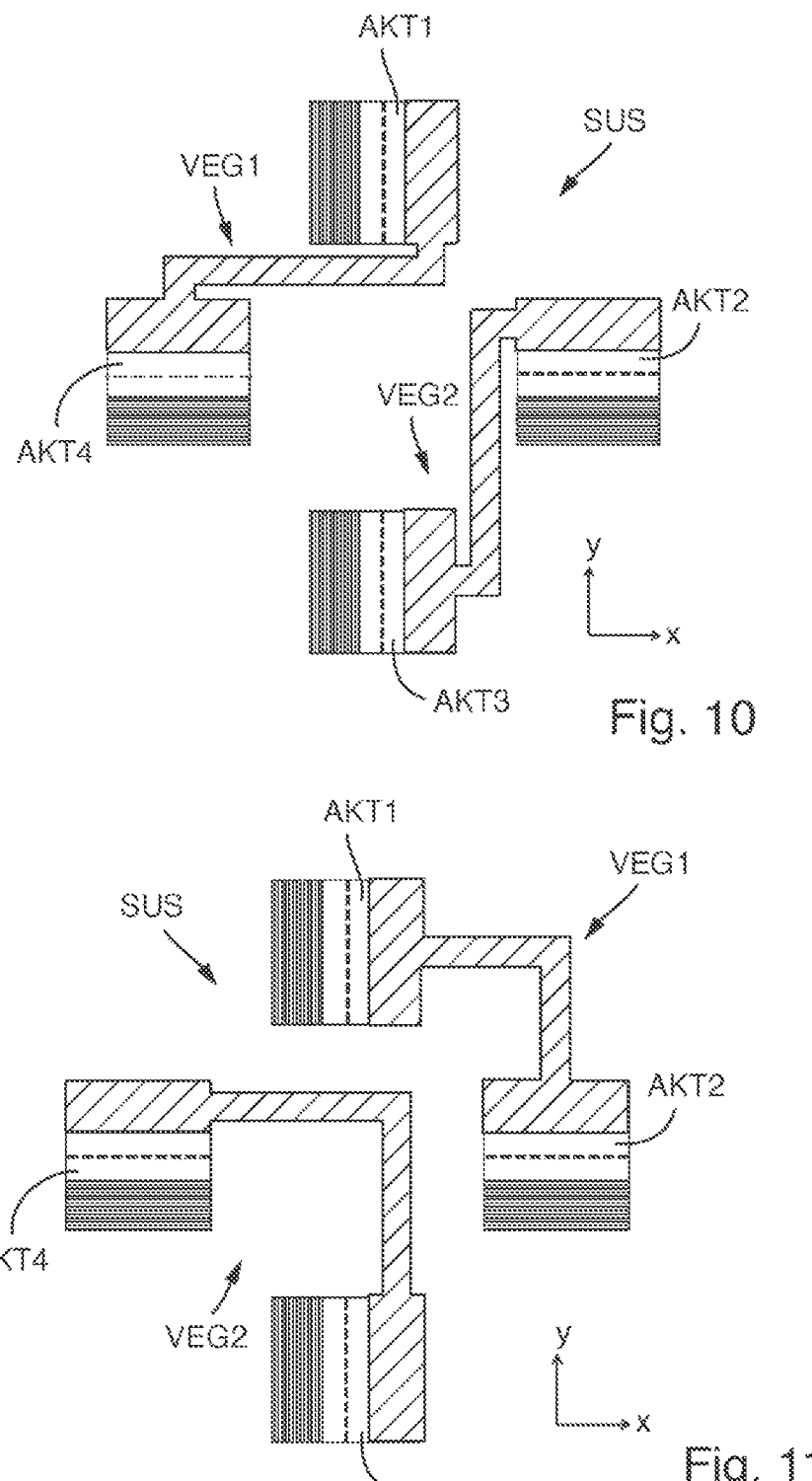

Using this principle, other arrangements of the connections between the elements are also conceivable and illustrated in FIGS. 8, 10 and 11. The arrangement in FIG. 8 involves more complex connection elements VE1, VE2 (angled three times) compared to the arrangement in FIG. 7. Both arrangements have in common that the two base linking elements BA1, BA2 are linked in each case on different sides to the actuator elements AKT1 and AKT3. The same applies to the mirror linking elements SA1, SA2 and the actuator elements AKT2 and AKT4. The result is that the actuator elements curve in each case differently when the mirror is tilted about an axis (see FIG. 9). This property is suitable for unimorph actuators. The actuator AKT1 is then active in the positive direction of rotation for example only when the mirror is tilted about the y-axis, while actuator AKT3 is active in the negative direction of rotation only when the mirror element is tilted about the y-axis. The same applies similarly to the actuators AKT2 and AKT4 for a mirror tilt about the x-axis.

In order to use bimorph actuators, it is, among other things, advantageous from a control point of view if the actuator elements assigned to a tilt axis in each case curve in the same direction when the mirror is tilted. To this end, the connection elements are linked to the substrate in each case on the same side of the actuator elements AKT1 and AKT3. The same applies to the connection elements with the mirror and the actuator elements AKT2 and AKT4. The arrangements in FIG. 10 and FIG. 11 satisfy this.

FIG. 9 shows a side view of two actuator elements. When the mirror is tilted by a specific angle, an actuator of the tilt axis (e.g. AKT1) bends upwards, while the other (e.g. AKT3) bends downwards. This is schematically shown in FIG. 9 and relates to the linking variants in FIGS. 7 and 8. By contrast, in the linking variants in FIGS. 10 and 11, both actuators of an axis (that is to say for example AKT1 and AKT3) bend in the same direction with a specific mirror tilt.

With the described arrangements of the actuator elements, a multiple articulation with two rotational degrees of freedom is formed, which enables the tilting of the mirror element ME about two axes in a respective positive and negative direction. By operating multiple actuators at the same time, combinations of mirror tilts about the x- and y-axes can be realized such that a total two-dimensional tilt field can be set.

Figure 12:
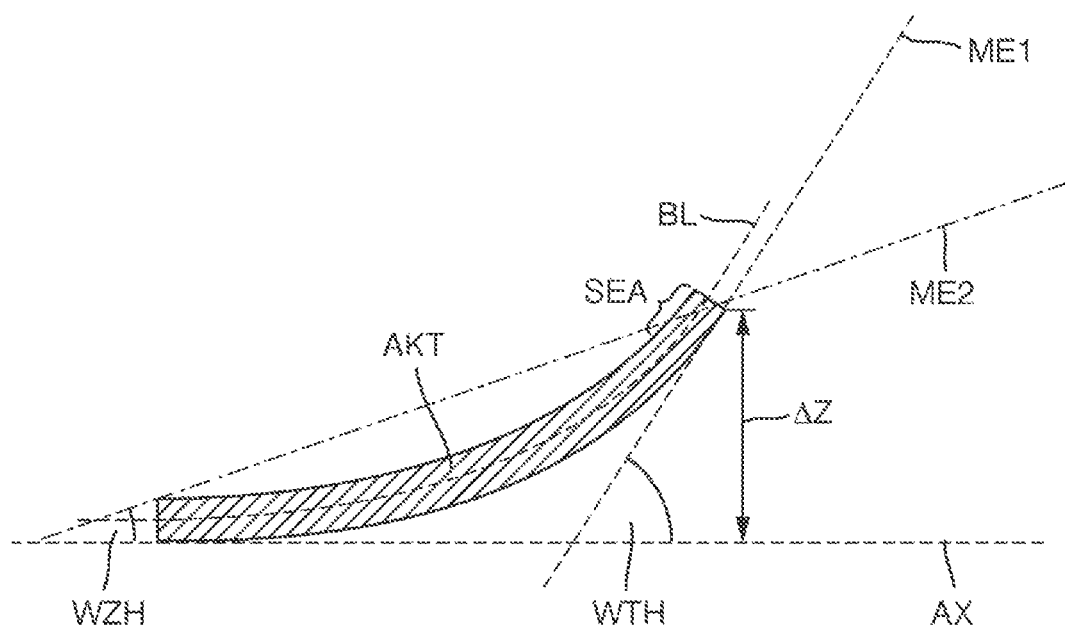
FIG. 12 illustrates the difference between a tilt of a mirror element due to tangential lift as opposed to a tilt of a mirror element due to z-lift.

One advantageous property of the described arrangements is the direct conversion of the tilt angle at the end of an actuator element into the tilt angle of the mirror (tilt by tangential lift). As illustrated in FIG. 12, this enables effective conversion of the bending of the piezoelectric actuator element AKT into a tilt of the mirror element. This is made possible by a rigid linking of the mirror element to the actuator element and also of the actuator elements among one another. The links and connection elements between the mirror element and actuator element and between the actuator elements should accordingly be designed to be as rigid as possible in the arrangements described.

It can be seen easily in FIG. 12 that the piezoelectrically active actuator element AKT is rigidly attached with a mirror-side end portion SEA to the mirror element ME1 in a manner such that the end portion SEA is aligned substantially parallel to the mirror surface (dashed line ME1). The bending line there extends practically parallel to the mirror surface. If any curvature is still present in this end portion, the link could in general terms also be designated a tangential link. To this extent, a tangential link within the meaning of this application is a link in which the mirror-side end portion is aligned parallel or at a very acute angle (for example approximately 1° or less) to the mirror surface. The link is at any rate rigid so that the orientation of the mirror-side end portion SEA directly determines the orientation of the mirror surface. This direct conversion is also referred to as tangential lift.

FIG. 12 illustrates the advantage of a tilt of the mirror element ME1 by tangential lift compared to a tilt of the mirror element ME2 by z-lift. Let the actuator element be planar in the non-actuated state and have a central longitudinal axis BL extending parallel to the axis AX. When the bending actuator AKT is actuated, bending occurs, wherein the bending line BL curves and at the same time remains in a plane (here: drawing plane). In the case of tilt by z-lift, the z-deflection $\Delta z$ at the end of the actuator element AKT would be used to tilt the mirror ME2 by a z-lift tilt angle WZH with respect to the axis AX. However, the already existing bending of the actuator element is not used here. A tilt with a tangential lift (see mirror M1) uses this bending and thereby achieves a tangential lift tilt angle WTH with respect to the axis AX, wherein WTH>WZH. In order to achieve a similarly large tilt angle with a tilt by z-lift as for a tilt by a tangential lift, very short lever arms would be involved, which are technically difficult to implement.

To manage a high thermal load it is advantageous to design the actuator elements and connection elements so that these, in summation, have the lowest possible thermal resistance. To this end, the cross-sectional area of the connection elements should be chosen to be as large as possible. In addition, wide actuator elements are advantageous, since they reduce the thermal resistance and at the same time do not negatively impact the maximum tilt angle.

FIGS. 7 and 8 to 11 already show that the bend-active length L, measured in the longitudinal direction of the actuators, between the linked ends is shorter than the width B measured in the width direction that is aligned perpendicular thereto. The width direction is in each case oriented parallel to the direction of the associated actuation axis. The aspect ratio L/B between length and width can be, for example, 0.5 or less or 0.4 or less or 0.3 or less or 0.2 or less or 0.1 or less, and frequently the aspect ratio lies in the range of 1:3 to 1:10. In this way, a low thermal resistance can be achieved, and in addition installation space for sensor elements is created.

Three exemplary embodiments for the actuator systems described will be illustrated below, which correspond to one possible implementation in terms of the proportions of the individual component elements to one another (FIG. 13A, FIG. 13B, FIG. 14 and FIG. 15). The exemplary embodiments here relate to the arrangement of the connection elements described with reference to FIG. 7, and therefore the corresponding reference signs are used. Analogously, the further described arrangements (FIGS. 8, 10 and 11) can also be implemented with connection elements in a different arrangement.

Electric contact with the actuator elements AKT can be established using electrical supply lines guided through the connection elements. The supply lines for establishing contact with the actuator elements AKT2 and AKT4 which lie further away from the base element are here guided past, among other things, the actuator elements AKT1 and AKT3 which lie closer to the base element. Actuator elements AKT1 and AKT3 can for this purpose be shortened (in the direction of the actuation axis), with the result that in each case a spring element extending parallel to the actuator elements can be introduced, through which the respective supply line passes. In the same way, the supply lines for a capacitive sensor system can be integrated.

Figure 16A:
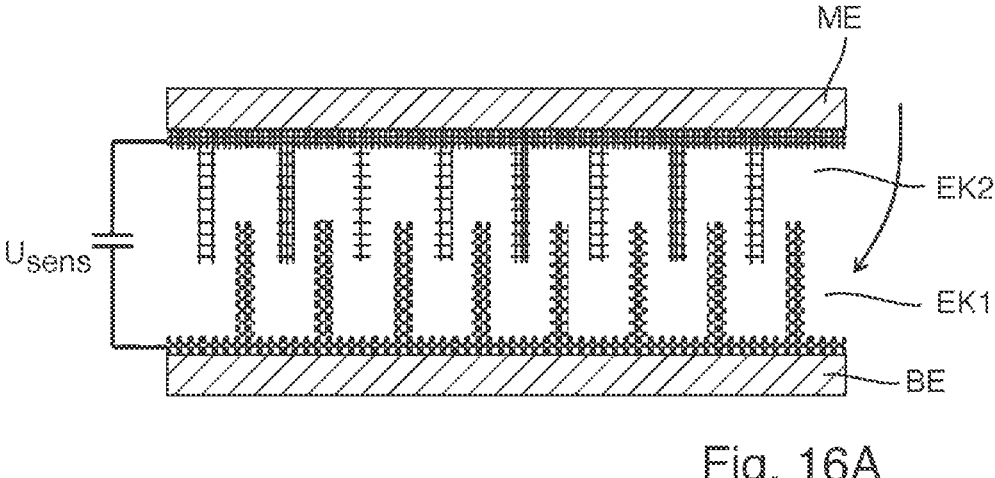
FIGS. 16A, 16B schematically show examples of capaci- tive sensors with comb electrodes.
Figure 16B:
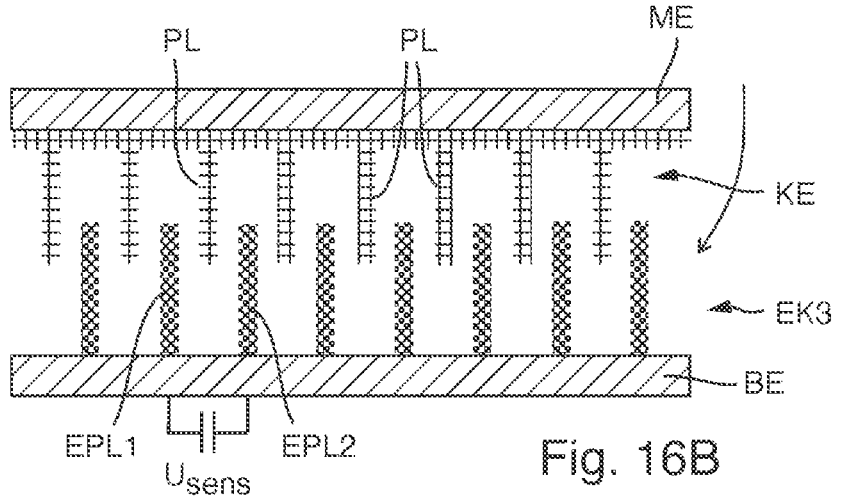

To detect the current tilt angle, capacitive sensors are integrated in the construction. FIGS. 16A and 16B show two variants using different measurement principles.

In the exemplary embodiment of FIG. 16A, intermeshing electrode combs EK1, EK2 are mounted both on the upper side of the base element BE and on the lower side of the mirror element ME such that an electrical capacitor is formed. An electrical voltage $U_{SENS}$ is applied between the electrode combs. If the tilt state of the mirror changes (curved arrow), the position of the electrodes relative to one another changes and consequently also the capacitance of the capacitor, which, with an electrical voltage that is kept constant, can be detected by an outflow or inflow of electrical charge, or, with current that is kept constant, by a change in the electrical voltage.

In the exemplary embodiment of FIG. 16B, the capacitive sensor has a comb electrode EK3 that is mounted or formed on the base element BE. Said comb electrode cooperates with a comb element KE, which is mounted or formed on the lower side of the mirror element ME and has a multiplicity of plates PL which are arranged at a distance from one another and in each case engage in an intermediate space between adjacent electrode plates EPL1, EPL2 of the EK3. The electrode plates EPL1, EPL2 etc. of the comb electrode EK3 are electrically insulated with respect to one another and are connected to a voltage source such that in each case adjacent electrode plates are at different electrical potentials (potential difference $U_{SENS}$) and thereby form a capacitor. The combs of the shield mounted on the mirror element ME (comb element KE) are kept at a defined electrical potential so as to prevent deposits from the plasma of the ambient atmosphere (negative pressure with low hydrogen partial pressure) that is produced due to the EUV radiation. When a mirror is tilted, the plates PL of the mirror element ME penetrate into the intermediate spaces between the electrode plates and act there in dependence on the penetration depth more or less strongly than shields and thereby change, in dependence on the tilt angle, the capacitance of the capacitors, which are formed on the base element BE from in each case adjacent plates of the comb electrodes. The electrodes on the base element can also be referred to as stator combs. Similarly, the combs in the mirror element can be referred to as moving combs. The combs of the shield mounted on the mirror element are kept at a defined electrical potential so as to prevent deposits from the plasma of the ambient atmosphere (negative pressure with low hydrogen partial pressure) produced due to the EUV radiation.

The different variants have specific advantages. In the arrangement of FIG. 16A, the sensitivity of the capacitive sensor is greater than in the variants of FIG. 16B. On the other hand, the variant of FIG. 16B offers advantages in terms of circuit technology, because the signals for the position determination of the mirror element here do not travel via lines that pass through deformable elements of the suspension system.

Different possibilities exist for the position and alignment of the electrodes, of which a few will be illustrated in the following exemplary embodiments (see FIGS. 17A to 17F). The different arrangements of the electrode combs are transferable here to the other exemplary embodiments for the actuators. The free areas between or outside the actuator structures are suitable for mounting the electrodes. From a process-technological point of view, it is generally advantageous to mount the electrodes in the same z-plane as the connection elements of the actuators. In order to achieve a measurement signal that is as great as possible, it is advantageous to mount the electrodes as far outside as possible, because in this case the translation of the electrode combs upon a rotation of the mirror about the x- or y-axis is greatest on the lower side of the mirror in the z-direction. In order to minimize a disturbance of adjacent mirror elements, it may be useful to arrange a shield around the electrodes (see U.S. Pat. No. 10,514,276 B2).

Figure 13A:
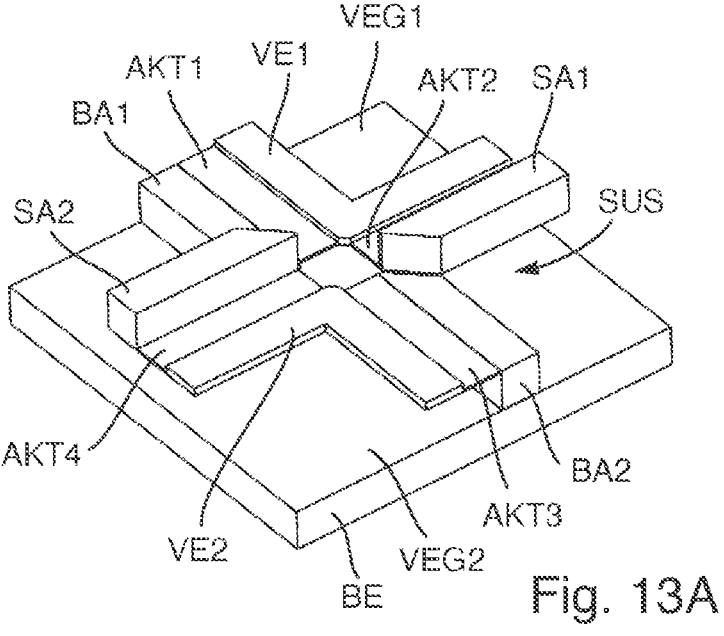
FIGS. 13A, 13B and FIGS. 14 and 15 show different variants of mirror units with differently designed suspension and actuator systems.
Figure 13B:
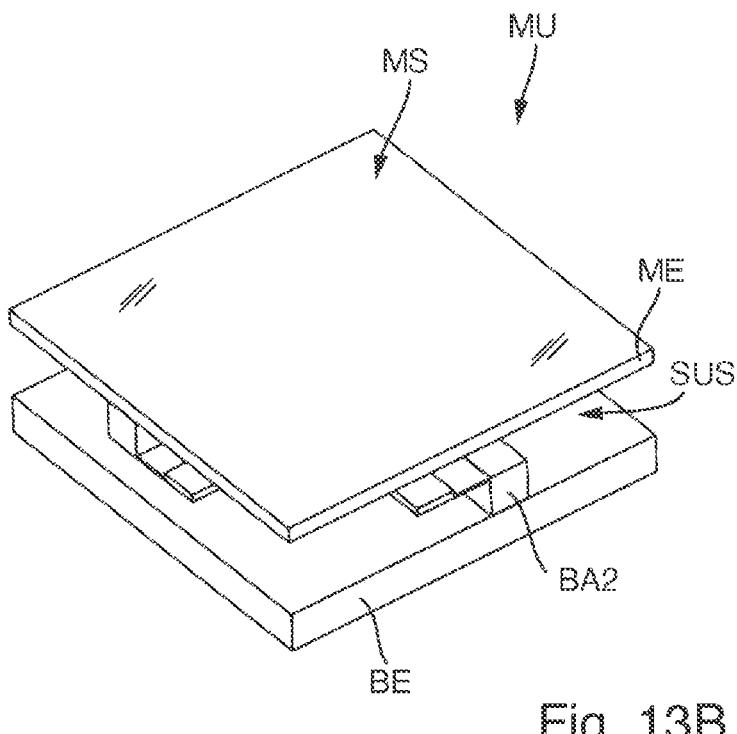
Figure 14:
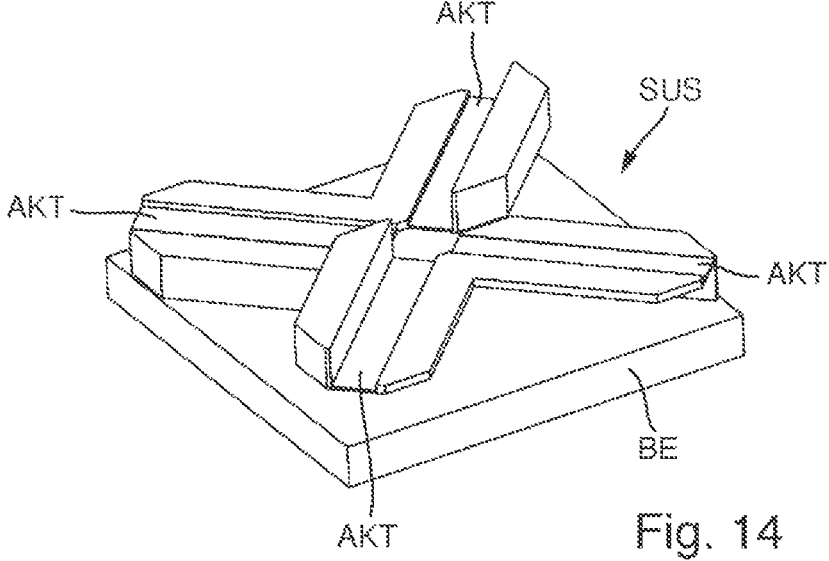
Figure 15:
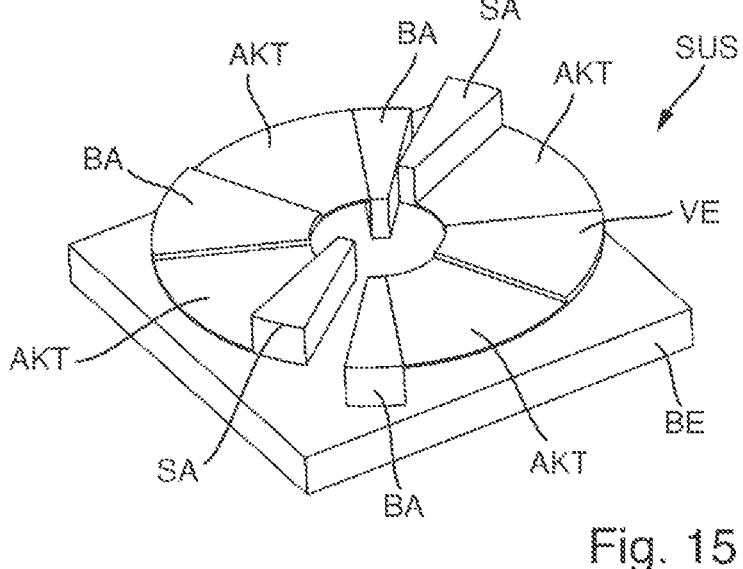
Figures 17A, 17B, 17C, 17D, 17E, 17F:
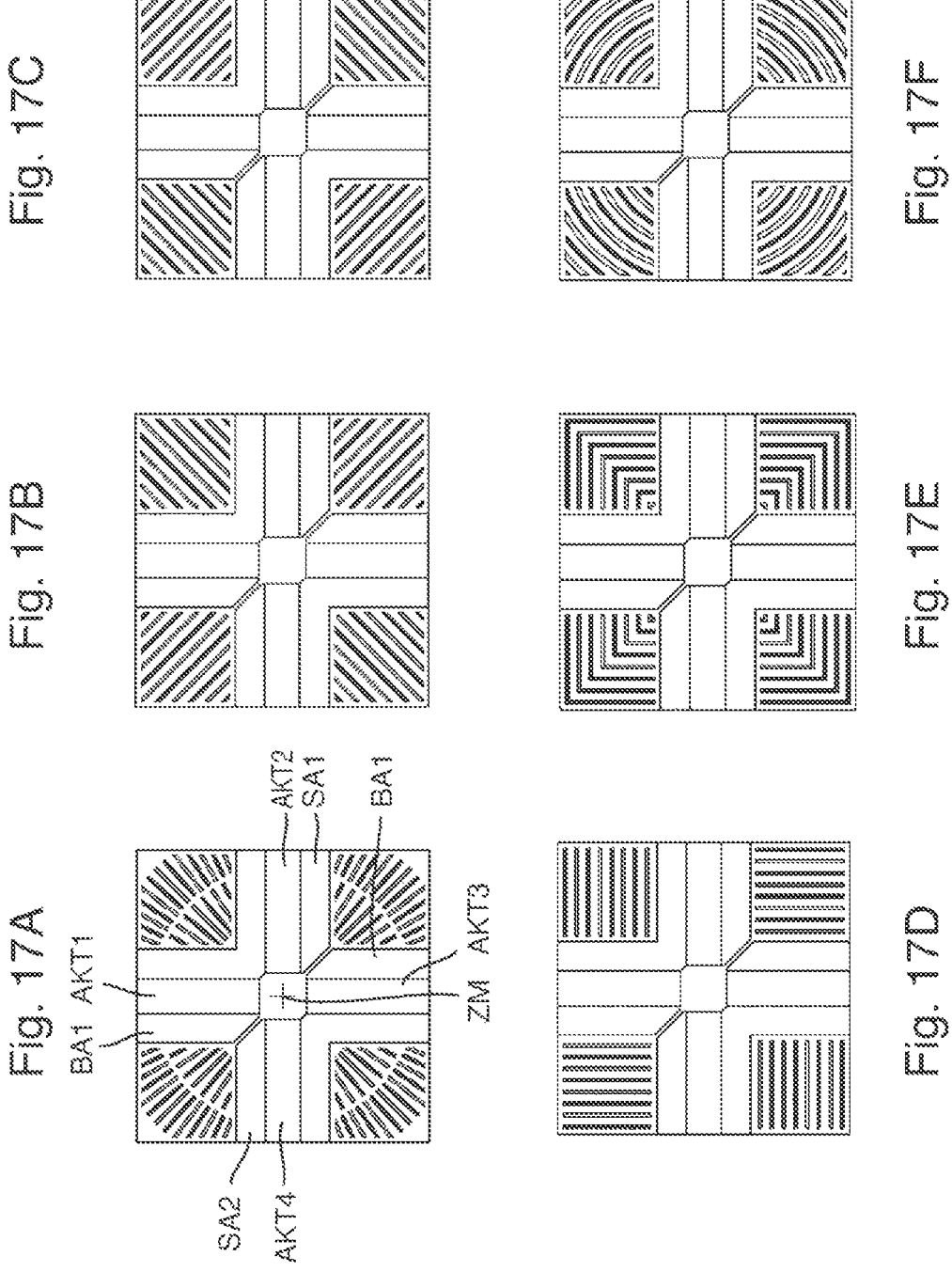
FIGS. 17A to 17F show different possibilities for the spatial arrangement of comb electrodes of a capacitive sensor system.

FIGS. 17A to 17F each show plan views of parts of mirror units according to FIG. 13A. Here, the connection elements VE1, VE2 of the connection groups are designed in each case to be isosceles-angular with 90° angles between the relatively narrow legs, such that substantially square regions in the four corners of the square mirror element ME of the square base element BE remain free. Plates or plate-type fingers of comb electrodes are disposed there. In the figures, the plates assigned to the base element BE are drawn in black, while the plates mounted on the lower side of the mirror element ME are drawn in a light shade. In the example of FIG. 17A, the plates are oriented in each case radially with respect to the center ZM of the mirror unit and are arranged in two coaxial circular segments in the corner regions. In the examples of FIGS. 17B, 17C and 17D, plates arranged in each case in diagonally opposite corner regions are oriented parallel to one another and perpendicular to a radial direction leading into the corner regions, wherein the orientation in the other diagonal is orthogonal thereto. In the arrangement of FIG. 17E, the individual electrode plates are formed in each case as right angles with legs of equal lengths. The arrangement in FIG. 17F provides arcuately curved plates, which are arranged concentrically with respect to the center of the mirror unit. All electrode arrangements have in each case a four-fold rotational symmetry with respect to the center ZM. Other arrangements are possible.

A further possibility is to mount the electrodes in the free area around the center ZM of the mirror. In this case, the sensitivity to tilt movements of the mirror may well be lower, but the sensor is in this way also better shielded against disturbances from the outside, for example from adjacent mirrors.

In the exemplary embodiments illustrated, piezo actuators are used in combination with capacitive sensor elements. The piezo actuators are here implemented by way of piezoelectric layers and at the same time serve here as spring joints, with the result that the micromirror, that is to say the mirror element, can be tilted about two axes. The combs of the capacitive sensor are implemented on the lower side of the mirror substrate and the upper side of the substrate. It is thus possible to attain relatively large sensitivities, since the installation space for the sensor systems is relatively large and is additionally located in the outer regions of the mirror where the mirror movement upon tilting is the greatest. In addition, a capacitive sensor has only a low temperature sensitivity (in contrast to, for example, piezoresistive sensors).

A few features of the exemplary embodiments can be summarized for example as follows: The actuators enable implementation of large tilt angles due to the use of piezo elements having a high force density and the direct conversion of the bending of the piezo elements into a mirror tilt. The actuator elements do not involve much space, and therefore leave a lot of space for the integration of sensor systems and allow greater sensitivity. The producibility is simple because the design includes only few elements, includes simple elements, and all elements are situated in only a few planes. The system has a relatively low sensitivity to temperature fluctuations.

What is claimed is:

1. An extreme ultraviolet (EUV) multi-mirror arrangement, comprising:

a carrier structure;

a multiplicity of mirror units supported by the carrier structure, wherein:

the mirror units are disposed one next to another in a grid arrangement;

each mirror unit comprises a base element and, opposite the base element, an individually tiltable mirror element;

each individually tiltable mirror element comprises a mirror substrate comprising a face which faces away from the base element and which supports a reflection coating defining a mirror surface configured to reflect radiation;

between its base element and its mirror element, each mirror unit comprises: components of a suspension system configured to movably mount the mirror element on the base element; actuators of an actuator system configured to produce movements of the mirror element relative to the base element in response to receiving control signals; and sensors of a sensor system configured to capture the position of the mirror elements;

the actuator system comprises piezoelectric actuators; and the sensor system comprises capacitive sensors, and wherein:

the suspension system comprises a connection element group configured to mechanically connect the base element and the mirror substrate; and the connection element group comprises two independently controllable piezoelectric actuators having mutually orthogonal rotary actuation axes.

2. The EUV multi-mirror arrangement of claim 1, wherein the actuators of the actuator system, the components of the suspension system, and/or the sensor elements of sensors of the sensor system of a mirror unit comprise MEMS structures.

3. The EUV multi-mirror arrangement of claim 2, wherein the suspension system is flexible to provide restoring forces that result in a mirror element assuming a zero position without tilt in an absence of actuator forces.

4. The EUV multi-mirror arrangement of claim 1, wherein:

a piezoelectric actuator comprises a multilayer structure comprising a piezoelectric layer and a further layer;

the piezoelectric actuator has a first side and a second side opposite the first side;

the first side supports a first electrode layer configured to produce an electrical field penetrating the piezoelectric layer in a thickness direction;

the second side supports a second electrode layer configured to produce an electric field penetrating the piezoelectric layer in the thickness direction; and the piezoelectric layer is configured so that, when an electrical voltage is applied to the first and second electrode layers, the piezoelectric layer contracts in a direction perpendicular to the thickness direction to bend the multilayer structure.

5. The EUV multi-mirror arrangement of claim 4, wherein the further layer comprises a carrier layer comprising a non-piezoelectric material.

6. The EUV multi-mirror arrangement of claim 5, wherein the non-piezoelectric material comprises silicon or a silicon compound.

7. The EUV multi-mirror arrangement of claim 4, wherein the further layer comprises a further piezoelectric layer.

8. The EUV multi-mirror arrangement of claim 7, further comprising a common electrode layer between the piezoelectric layers.

9. The EUV multi-mirror arrangement of claim 4, wherein:

the multilayer structure further comprises a carrier layer comprising a non-piezoelectric material; and a piezoelectric layer is supported both sides of the carrier layer.

10. The EUV multi-mirror arrangement of claim 4, wherein the further layer comprises a piezoelectric actuator comprising at least two independently controllable piezoelectric layers.

11. The EUV multi-mirror arrangement of claim 4, wherein:

in a direction orthogonal to a bending line, the piezoelectric actuator has a rectangular cross section with an aspect ratio of greater than one between a width and a height; and the width is greater than a length effective along the bending line.

12. The EUV multi-mirror arrangement of claim 4, wherein:

the suspension system comprises first and second connection element groups;

each of the first and second connection element groups comprises first and second integrated, independently controllable piezoelectric actuators having mutually orthogonal rotary actuation axes;

each of the first and second connection groups comprises:

a base linking element fixedly linked with the base element;

a first piezoelectric actuator comprising a first end and a second end opposite the first end, the first end attached with the base linking element;

a flexurally stiff connection element attached with the second end of the first piezoelectric actuator;

a second piezoelectric actuator comprising first and second ends, the first end of the second piezoelectric actuator opposite the second end of the second piezoelectric actuator, the first end of the second piezoelectric actuator attached with the flexurally stiff connection element, and the second end of the second piezoelectric actuator attached with a mirror linking element which is fixedly connected to the mirror element.

13. The EUV multi-mirror arrangement of claim 4, wherein the piezoelectric actuator comprises a mirror-side end portion is connected to the mirror element via a rigid link.

14. The EUV multi-mirror arrangement of claim 1, wherein the sensor system comprises a comb electrode comprising a multiplicity of electrode plates disposed one next to the other with a mutual distance.

15. The EUV multi-mirror arrangement of claim 14, wherein:

a capacitive sensor comprises two comb electrodes assigned to each other with alternately intermeshing electrode plates;

comb electrodes of one pair are configured to be electrically connected to a voltage source at different potentials during operation.

16. An illumination system, comprising:

an EUV multi-mirror arrangement according to claim 1, wherein the illumination system is an EUV microlithography illumination system configured to receive EUV radiation to shape at least a portion of the EUV radiation into illumination radiation directed into an illumination field in an exit plane of the illumination system.

17. An extreme ultraviolet (EUV) multi-mirror arrangement, comprising:

a carrier structure;

a multiplicity of mirror units supported by the carrier structure, wherein:

the mirror units are disposed one next to another in a grid arrangement;

each mirror unit comprises a base element and, opposite the base element, an individually tiltable mirror element;

each individually tiltable mirror element comprises a mirror substrate comprising a face which faces away from the base element and which supports a reflection coating defining a mirror surface configured to reflect radiation;

between its base element and its mirror element, each mirror unit comprises: components of a suspension system configured to movably mount the mirror element on the base element; actuators of an actuator system configured to produce movements of the mirror element relative to the base element in response to receiving control signals; and sensors of a sensor system configured to capture the position of the mirror elements;

the actuator system comprises piezoelectric actuators; and the sensor system comprises capacitive sensors, and wherein:

a piezoelectric actuator comprises a multilayer structure comprising a piezoelectric layer and a further layer;

the piezoelectric actuator has a first side and a second side opposite the first side;

the first side supports a first electrode layer configured to produce an electrical field penetrating the piezoelectric layer in a thickness direction;

the second side supports a second electrode layer configured to produce an electric field penetrating the piezoelectric layer in the thickness direction; and the piezoelectric layer is configured so that, when an electrical voltage is applied to the first and second electrode layers, the piezoelectric layer contracts in a direction perpendicular to the thickness direction to bend the multilayer structure;

the suspension system comprises first and second connection element groups;

each of the first and second connection element groups comprises first and second integrated, independently controllable piezoelectric actuators having mutually orthogonal rotary actuation axes; and each of the first and second connection groups comprises:

a base linking element fixedly linked with the base element;

a first piezoelectric actuator comprising a first end and a second end opposite the first end, the first end attached with the base linking element;

a flexurally stiff connection element attached with the second end of the first piezoelectric actuator; and a second piezoelectric actuator comprising first and second ends, the first end of the second piezoelectric actuator opposite the second end of the second piezoelectric actuator, the first end of the second piezoelectric actuator attached with the flexurally stiff connection element, and the second end of the second piezoelectric actuator attached with a mirror linking element which is fixedly connected to the mirror element.

18. The EUV multi-mirror arrangement of claim 17, wherein:

the first piezoelectric actuators have first rotary actuation axes and are configured so that the first rotary actuation axes are aligned coaxially to one another;

the second piezoelectric actuators have second rotary actuation axes and are configured so that the second rotary actuation axes are aligned coaxially to one another and orthogonally to the first rotary actuation axes.

19. An extreme ultraviolet (EUV) multi-mirror arrangement, comprising:

a carrier structure;

a multiplicity of mirror units supported by the carrier structure, wherein:

the mirror units are disposed one next to another in a grid arrangement;

each mirror unit comprises a base element and, opposite the base element, an individually tiltable mirror element;

each individually tiltable mirror element comprises a mirror substrate comprising a face which faces away from the base element and which supports a reflection coating defining a mirror surface configured to reflect radiation;

between its base element and its mirror element, each mirror unit comprises: components of a suspension system configured to movably mount the mirror element on the base element; actuators of an actuator system configured to produce movements of the mirror element relative to the base element in response to receiving control signals; and sensors of a sensor system configured to capture the position of the mirror elements;

the actuator system comprises piezoelectric actuators; and the sensor system comprises capacitive sensors, wherein:

a piezoelectric actuator comprises a multilayer structure comprising a piezoelectric layer and a further layer;

the piezoelectric actuator has a first side and a second side opposite the first side;

the first side supports a first electrode layer configured to produce an electrical field penetrating the piezoelectric layer in a thickness direction;

the second side supports a second electrode layer configured to produce an electric field penetrating the piezoelectric layer in the thickness direction;

the piezoelectric layer is configured so that, when an electrical voltage is applied to the first and second electrode layers, the piezoelectric layer contracts in a direction perpendicular to the thickness direction to bend the multilayer structure; and the piezoelectric actuator comprises a mirror-side end portion is connected to the mirror element via a rigid link.

20. The EUV multi-mirror arrangement of claim 19, wherein the rigid link is configured so that the mirror surface in every bending position of the piezoelectric actuator is aligned tangentially to the mirror-side end portion.

* * * * *